(12) United States Patent
Honer

(10) Patent No.: US 8,143,095 B2
(45) Date of Patent: Mar. 27, 2012

(54) SEQUENTIAL FABRICATION OF VERTICAL CONDUCTIVE INTERCONNECTS IN CAPPED CHIPS

(75) Inventor: Kenneth Allen Honer, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 922 days.

(21) Appl. No.: 11/319,836

(22) Filed: Dec. 28, 2005

(65) Prior Publication Data

US 2007/0145564 A1    Jun. 28, 2007

Related U.S. Application Data

(60) Provisional application No. 60/732,679, filed on Nov. 2, 2005, provisional application No. 60/664,129, filed on Mar. 22, 2005, provisional application No. 60/707,813, filed on Aug. 12, 2005, provisional application No. 60/736,195, filed on Nov. 14, 2005.

(51) Int. Cl.
    *H01L 21/00* (2006.01)
(52) U.S. Cl. ............ 438/106; 438/615; 257/E21.499
(58) Field of Classification Search .......... 438/51, 438/55; 257/E21.499, E21.511, E23.067, 257/E23.085
See application file for complete search history.

(56) References Cited

U.S. PATENT DOCUMENTS

| | | | |
|---|---|---|---|
| 2,507,956 A | 5/1950 | Bruno et al. |
| 2,796,370 A | 6/1957 | Ostrander et al. |
| 2,851,385 A | 9/1958 | Spruance, Jr. et al. |
| 3,648,131 A | 3/1972 | Stuby |
| 3,761,782 A | 9/1973 | Youmans |
| 3,981,023 A | 9/1976 | King et al. |
| 4,259,679 A | 3/1981 | Knibb et al. |
| 4,279,690 A | 7/1981 | Dierschke |
| 4,339,689 A | 7/1982 | Yamanaka et al. |
| 4,551,629 A | 11/1985 | Carson et al. |
| 4,764,846 A | 8/1988 | Go |
| 4,774,630 A | 9/1988 | Reisman et al. |
| 4,794,092 A | 12/1988 | Solomon |
| 4,797,179 A | 1/1989 | Watson et al. |
| 4,806,106 A | 2/1989 | Mebane et al. |

(Continued)

FOREIGN PATENT DOCUMENTS

EP    506491    9/1992

(Continued)

OTHER PUBLICATIONS

U.S. Appl. No. 10/077,388, filed Feb. 15, 2002, assigned to Tessera, Inc.

(Continued)

*Primary Examiner* — Matthew Landau
*Assistant Examiner* — Latanya N Crawford
(74) *Attorney, Agent, or Firm* — Lerner, David, Littenberg, Krumholz & Mentlik, LLP

(57) ABSTRACT

A method is provided of forming a capped chip which includes a conductive interconnect exposed through an opening in the cap. A cap having openings extending between outer and inner surfaces is aligned and joined to a chip. A mass of fusible conductive material is positioned through a first such opening onto a first such bond pad of the chip. The positioned mass is heated to bond the mass to the first bond pad. The steps of positioning and heating the mass form at least a portion of a conductive interconnect extending from the first bond pad at least partially through the first opening.

5 Claims, 6 Drawing Sheets

U.S. PATENT DOCUMENTS

| | | |
|---|---|---|
| 4,825,284 A | 4/1989 | Soga et al. |
| 4,827,376 A | 5/1989 | Voss |
| 4,862,197 A | 8/1989 | Stoffel |
| 4,862,249 A | 8/1989 | Carlson |
| 4,933,601 A | 6/1990 | Sagawa et al. |
| 4,984,358 A | 1/1991 | Nelson |
| 5,070,297 A | 12/1991 | Kwon et al. |
| 5,072,520 A | 12/1991 | Nelson |
| 5,104,820 A | 4/1992 | Go et al. |
| 5,118,924 A | 6/1992 | Mehra et al. |
| 5,124,543 A | 6/1992 | Kawashima |
| 5,126,286 A | 6/1992 | Chance |
| 5,148,265 A | 9/1992 | Khandros et al. |
| 5,148,266 A | 9/1992 | Khandros et al. |
| 5,177,753 A | 1/1993 | Tanaka |
| 5,187,122 A | 2/1993 | Bonis |
| 5,198,963 A | 3/1993 | Gupta et al. |
| 5,220,838 A | 6/1993 | Fung et al. |
| 5,250,462 A | 10/1993 | Sasaki et al. |
| 5,266,501 A | 11/1993 | Imai |
| 5,266,833 A | 11/1993 | Capps |
| 5,285,352 A | 2/1994 | Pastore et al. |
| 5,321,303 A | 6/1994 | Kawahara et al. |
| 5,335,210 A | 8/1994 | Bernstein |
| 5,347,159 A | 9/1994 | Khandros et al. |
| 5,382,829 A | 1/1995 | Inoue |
| 5,390,844 A | 2/1995 | Distefano et al. |
| 5,398,863 A | 3/1995 | Grube et al. |
| 5,438,305 A | 8/1995 | Hikita et al. |
| 5,448,014 A | 9/1995 | Kong et al. |
| 5,473,190 A | 12/1995 | Inoue et al. |
| 5,486,720 A | 1/1996 | Kierse |
| 5,491,302 A | 2/1996 | Distefano et al. |
| 5,500,540 A | 3/1996 | Jewell et al. |
| 5,504,035 A | 4/1996 | Rostoker et al. |
| 5,518,964 A | 5/1996 | DiStefano et al. |
| 5,526,449 A | 6/1996 | Meade et al. |
| 5,530,288 A | 6/1996 | Stone |
| 5,536,909 A | 7/1996 | DiStefano et al. |
| 5,546,654 A | 8/1996 | Wojnarowski et al. |
| 5,557,501 A | 9/1996 | DiStefano et al. |
| 5,567,657 A | 10/1996 | Wojnarowski et al. |
| 5,576,680 A | 11/1996 | Ling |
| 5,578,874 A | 11/1996 | Kurogi et al. |
| 5,595,930 A | 1/1997 | Baek |
| 5,608,262 A | 3/1997 | Degani et al. |
| 5,610,431 A | 3/1997 | Martin |
| 5,612,570 A | 3/1997 | Eide et al. |
| 5,629,239 A | 5/1997 | DiStefano et al. |
| 5,629,241 A | 5/1997 | Matloubian et al. |
| 5,633,785 A | 5/1997 | Parker et al. |
| 5,642,261 A | 6/1997 | Bond et al. |
| 5,657,206 A | 8/1997 | Pedersen et al. |
| 5,659,952 A | 8/1997 | Kovac et al. |
| 5,661,087 A | 8/1997 | Pedersen et al. |
| 5,668,033 A | 9/1997 | Ohara et al. |
| 5,672,519 A | 9/1997 | Song et al. |
| 5,675,180 A | 10/1997 | Pedersen et al. |
| 5,677,200 A | 10/1997 | Park et al. |
| 5,677,569 A | 10/1997 | Choi et al. |
| 5,679,977 A | 10/1997 | Khandros et al. |
| 5,688,716 A | 11/1997 | DiStefano et al. |
| 5,703,400 A | 12/1997 | Wojnarowski et al. |
| 5,705,858 A | 1/1998 | Tsukamoto |
| 5,706,174 A | 1/1998 | Distefano et al. |
| 5,717,245 A | 2/1998 | Pedder |
| 5,747,870 A | 5/1998 | Pedder |
| 5,757,074 A | 5/1998 | Matloubian et al. |
| 5,766,987 A | 6/1998 | Mitchell et al. |
| 5,787,581 A | 8/1998 | DiStefano et al. |
| 5,798,286 A | 8/1998 | Faraci et al. |
| 5,798,557 A | 8/1998 | Salatino et al. |
| 5,801,474 A | 9/1998 | Sakairi et al. |
| 5,814,894 A | 9/1998 | Igarashi et al. |
| 5,817,541 A | 10/1998 | Averkiou et al. |
| 5,821,609 A | 10/1998 | DiStefano et al. |
| 5,830,782 A | 11/1998 | Smith et al. |
| 5,837,562 A | 11/1998 | Cho |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,869,887 A | 2/1999 | Urushima |
| 5,869,894 A | 2/1999 | Degani et al. |
| 5,872,697 A | 2/1999 | Christensen et al. |
| 5,886,393 A | 3/1999 | Merrill et al. |
| 5,888,884 A | 3/1999 | Wojnarowski |
| 5,891,761 A | 4/1999 | Vindasius et al. |
| 5,892,417 A | 4/1999 | Johnson et al. |
| 5,895,233 A | 4/1999 | Higashi et al. |
| 5,895,972 A | 4/1999 | Paniccia |
| 5,900,674 A | 5/1999 | Wojnarowski et al. |
| 5,905,639 A | 5/1999 | Warren |
| 5,909,052 A | 6/1999 | Ohta et al. |
| 5,910,687 A | 6/1999 | Chen et al. |
| 5,913,109 A | 6/1999 | Distefano et al. |
| 5,915,168 A | 6/1999 | Salatino et al. |
| 5,915,752 A | 6/1999 | DiStefano et al. |
| 5,918,112 A | 6/1999 | Shah et al. |
| 5,920,142 A | 7/1999 | Onishi et al. |
| 5,929,517 A | 7/1999 | Distefano et al. |
| 5,938,452 A | 8/1999 | Wojnarowski |
| 5,952,712 A | 9/1999 | Ikuina et al. |
| 5,965,933 A | 10/1999 | Young et al. |
| 5,973,391 A | 10/1999 | Bischoff et al. |
| 5,976,913 A | 11/1999 | Distefano et al. |
| 5,985,695 A | 11/1999 | Freyman et al. |
| 5,986,746 A | 11/1999 | Metz et al. |
| 5,991,989 A | 11/1999 | Onishi et al. |
| 5,993,981 A | 11/1999 | Askinazi et al. |
| 6,002,163 A | 12/1999 | Wojnarowski |
| 6,005,466 A | 12/1999 | Pedder |
| 6,011,330 A | 1/2000 | Goodman et al. |
| 6,020,217 A | 2/2000 | Kuisl et al. |
| 6,037,659 A | 3/2000 | Weixel |
| 6,046,076 A | 4/2000 | Mitchell et al. |
| 6,046,410 A | 4/2000 | Wojnarowski et al. |
| 6,049,470 A | 4/2000 | Weale |
| 6,049,972 A | 4/2000 | Link et al. |
| 6,054,756 A | 4/2000 | DiStefano et al. |
| 6,072,236 A | 6/2000 | Akram et al. |
| 6,075,289 A | 6/2000 | Distefano |
| 6,080,596 A | 6/2000 | Vindasius et al. |
| 6,081,035 A | 6/2000 | Warner et al. |
| 6,092,280 A | 7/2000 | Wojnarowski |
| 6,093,888 A | 7/2000 | Laureanti et al. |
| 6,094,138 A | 7/2000 | Eberhardt et al. |
| 6,098,278 A | 8/2000 | Vindasius et al. |
| 6,100,594 A | 8/2000 | Fukui et al. |
| 6,104,272 A | 8/2000 | Yamamoto et al. |
| 6,121,676 A | 9/2000 | Solberg |
| 6,122,009 A | 9/2000 | Ueda et al. |
| 6,124,179 A | 9/2000 | Adamic, Jr. |
| 6,124,546 A | 9/2000 | Hayward et al. |
| 6,124,637 A | 9/2000 | Freyman et al. |
| 6,133,626 A | 10/2000 | Hawke et al. |
| 6,134,118 A | 10/2000 | Pedersen et al. |
| 6,140,144 A | 10/2000 | Najafi et al. |
| 6,156,652 A | 12/2000 | Michalicek |
| 6,156,980 A | 12/2000 | Peugh et al. |
| 6,165,814 A | 12/2000 | Wark et al. |
| 6,169,328 B1 | 1/2001 | Mitchell et al. |
| 6,181,015 B1 | 1/2001 | Gotoh et al. |
| 6,194,774 B1 | 2/2001 | Cheon |
| 6,214,644 B1 | 4/2001 | Glenn |
| 6,218,729 B1 | 4/2001 | Zavrel, Jr. et al. |
| 6,221,751 B1 | 4/2001 | Chen et al. |
| 6,225,688 B1 | 5/2001 | Kim et al. |
| 6,225,694 B1 | 5/2001 | Terui et al. |
| 6,228,686 B1 | 5/2001 | Smith et al. |
| 6,229,200 B1 | 5/2001 | McLellan et al. |
| 6,229,427 B1 | 5/2001 | Kurtz et al. |
| 6,235,141 B1 | 5/2001 | Feldman et al. |
| 6,238,949 B1 | 5/2001 | Nguyen et al. |
| 6,238,950 B1 | 5/2001 | Howser et al. |
| 6,249,039 B1 | 6/2001 | Harvey et al. |

| Patent No. | Date | Inventor(s) | |
|---|---|---|---|
| 6,252,778 B1 | 6/2001 | Tonegawa et al. | |
| 6,255,714 B1 | 7/2001 | Kossives et al. | |
| 6,261,945 B1 | 7/2001 | Nye, III et al. | |
| 6,265,246 B1 * | 7/2001 | Ruby et al. ................ 438/113 | |
| 6,265,763 B1 | 7/2001 | Jao et al. | |
| 6,274,937 B1 | 8/2001 | Ahn et al. | |
| 6,279,227 B1 | 8/2001 | Khandros et al. | |
| 6,281,570 B1 | 8/2001 | Kameyama et al. | |
| 6,285,064 B1 | 9/2001 | Foster | |
| 6,292,086 B1 | 9/2001 | Chu | |
| 6,309,910 B1 | 10/2001 | Haba et al. | |
| 6,310,386 B1 | 10/2001 | Shenoy | |
| 6,316,840 B1 | 11/2001 | Otani et al. | |
| 6,321,444 B1 | 11/2001 | Yatsuda et al. | |
| 6,323,735 B1 | 11/2001 | Welland et al. | |
| 6,326,689 B1 | 12/2001 | Thomas | |
| 6,326,696 B1 | 12/2001 | Horton et al. | |
| 6,326,697 B1 | 12/2001 | Farnworth | |
| 6,329,715 B1 | 12/2001 | Hayashi | |
| 6,342,406 B1 | 1/2002 | Glenn et al. | |
| 6,344,688 B1 | 2/2002 | Wang | |
| 6,353,263 B1 | 3/2002 | Dotta et al. | |
| 6,362,525 B1 | 3/2002 | Rahim | |
| 6,366,629 B1 | 4/2002 | Chen et al. | |
| 6,373,130 B1 | 4/2002 | Salaville | |
| 6,376,279 B1 | 4/2002 | Kwon et al. | |
| 6,377,464 B1 | 4/2002 | Hashemi et al. | |
| 6,384,397 B1 | 5/2002 | Takiar et al. | |
| 6,387,747 B1 | 5/2002 | Cha et al. | |
| 6,387,793 B1 | 5/2002 | Yap et al. | |
| 6,396,043 B1 | 5/2002 | Glenn et al. | |
| 6,396,116 B1 | 5/2002 | Kelly et al. | |
| 6,396,470 B1 | 5/2002 | Zhang et al. | |
| 6,404,131 B1 | 6/2002 | Kawano et al. | |
| 6,420,208 B1 | 7/2002 | Pozder et al. | |
| 6,429,036 B1 | 8/2002 | Nixon et al. | |
| 6,429,511 B2 | 8/2002 | Ruby et al. | |
| 6,441,481 B1 | 8/2002 | Karpman | |
| 6,449,828 B2 | 9/2002 | Pahl et al. | |
| 6,452,238 B1 | 9/2002 | Orcutt et al. | |
| 6,459,150 B1 * | 10/2002 | Wu et al. ................ 257/724 | |
| 6,480,389 B1 | 11/2002 | Shie et al. | |
| 6,492,194 B1 | 12/2002 | Bureau et al. | |
| 6,492,201 B1 | 12/2002 | Haba | |
| 6,493,240 B2 | 12/2002 | Broglia et al. | |
| 6,493,861 B1 | 12/2002 | Li et al. | |
| 6,498,099 B1 | 12/2002 | McLellan et al. | |
| 6,498,381 B2 | 12/2002 | Halahan et al. | |
| 6,521,987 B1 | 2/2003 | Glenn et al. | |
| 6,548,911 B2 | 4/2003 | Yu et al. | |
| 6,550,664 B2 | 4/2003 | Bradley et al. | |
| 6,552,475 B2 | 4/2003 | Hori et al. | |
| 6,555,901 B1 | 4/2003 | Yoshihara et al. | |
| 6,562,647 B2 | 5/2003 | Zandman et al. | |
| 6,583,444 B2 | 6/2003 | Fjelstad | |
| 6,583,513 B1 | 6/2003 | Utagikar et al. | |
| 6,596,634 B2 * | 7/2003 | Umetsu et al. ................ 438/666 | |
| 6,607,941 B2 | 8/2003 | Prabhu et al. | |
| 6,621,163 B2 | 9/2003 | Weekamp et al. | |
| 6,624,505 B2 | 9/2003 | Badehi | |
| 6,627,864 B1 | 9/2003 | Glenn et al. | |
| 6,627,985 B2 | 9/2003 | Huppenthal et al. | |
| 6,627,998 B1 | 9/2003 | Caletka et al. | |
| 6,646,289 B1 | 11/2003 | Badehi | |
| 6,656,827 B1 | 12/2003 | Tsao et al. | |
| 6,657,296 B2 | 12/2003 | Ho et al. | |
| 6,664,624 B2 | 12/2003 | Haematsu et al. | |
| 6,670,206 B2 | 12/2003 | Kim et al. | |
| 6,670,215 B2 | 12/2003 | Miyazaki et al. | |
| 6,674,159 B1 | 1/2004 | Peterson et al. | |
| 6,678,167 B1 | 1/2004 | Degani et al. | |
| 6,693,361 B1 | 2/2004 | Siniaguine et al. | |
| 6,699,730 B2 | 3/2004 | Kim et al. | |
| 6,710,456 B1 | 3/2004 | Jiang et al. | |
| 6,717,254 B2 | 4/2004 | Siniaguine | |
| 6,734,040 B2 | 5/2004 | Yamaguchi et al. | |
| 6,744,109 B2 | 6/2004 | Barton et al. | |
| 6,753,205 B2 | 6/2004 | Halahan | |
| 6,768,190 B2 | 7/2004 | Yang et al. | |
| 6,784,020 B2 | 8/2004 | Lee et al. | |
| 6,787,916 B2 | 9/2004 | Halahan | |
| 6,798,070 B2 | 9/2004 | Funaya et al. | |
| 6,809,412 B1 | 10/2004 | Tourino et al. | |
| 6,818,545 B2 | 11/2004 | Lee et al. | |
| 6,822,324 B2 | 11/2004 | Tao et al. | |
| 6,830,877 B2 | 12/2004 | Ma et al. | |
| 6,849,916 B1 | 2/2005 | Glenn et al. | |
| 6,903,012 B2 | 6/2005 | Geefay et al. | |
| 6,903,883 B2 | 6/2005 | Amanai et al. | |
| 6,933,616 B2 | 8/2005 | Fang | |
| 6,940,158 B2 | 9/2005 | Haba et al. | |
| 6,955,943 B2 * | 10/2005 | Zakel et al. ................ 438/106 | |
| 6,972,480 B2 | 12/2005 | Zilber et al. | |
| 6,982,475 B1 | 1/2006 | MacIntyre | |
| 6,995,462 B2 | 2/2006 | Bolken et al. | |
| 7,033,664 B2 | 4/2006 | Zilber et al. | |
| 7,265,440 B2 | 9/2007 | Zilber et al. | |
| 2001/0009300 A1 | 7/2001 | Sugimura | |
| 2001/0013653 A1 | 8/2001 | Shoji | |
| 2001/0033478 A1 | 10/2001 | Ortiz et al. | |
| 2002/0016024 A1 | 2/2002 | Thomas | |
| 2002/0017699 A1 | 2/2002 | Shenoy | |
| 2002/0056900 A1 | 5/2002 | Liu et al. | |
| 2002/0074668 A1 | 6/2002 | Hofstee et al. | |
| 2002/0089835 A1 | 7/2002 | Simmons | |
| 2002/0090803 A1 | 7/2002 | Salaville | |
| 2002/0102004 A1 | 8/2002 | Minervini | |
| 2002/0170175 A1 | 11/2002 | Aigner et al. | |
| 2002/0179696 A1 * | 12/2002 | Pattanaik et al. ................ 228/246 | |
| 2002/0195700 A1 | 12/2002 | Li | |
| 2003/0001252 A1 | 1/2003 | Ku et al. | |
| 2003/0017687 A1 * | 1/2003 | Hembree ................ 438/586 | |
| 2003/0025204 A1 | 2/2003 | Sakai | |
| 2003/0038327 A1 | 2/2003 | Smith | |
| 2003/0047797 A1 | 3/2003 | Kuan et al. | |
| 2003/0052404 A1 | 3/2003 | Thomas | |
| 2003/0067073 A1 | 4/2003 | Akram et al. | |
| 2003/0133588 A1 | 7/2003 | Pedersen | |
| 2003/0148578 A1 | 8/2003 | Ku et al. | |
| 2003/0151139 A1 | 8/2003 | Kimura | |
| 2003/0159276 A1 | 8/2003 | Wakefield | |
| 2003/0168725 A1 | 9/2003 | Warner et al. | |
| 2004/0007774 A1 | 1/2004 | Crane, Jr. et al. | |
| 2004/0029356 A1 * | 2/2004 | Timme et al. ................ 438/455 | |
| 2004/0041249 A1 | 3/2004 | Tsai et al. | |
| 2004/0069758 A1 * | 4/2004 | Azdasht et al. ................ 219/121.85 | |
| 2004/0099917 A1 | 5/2004 | Greathouse et al. | |
| 2004/0099938 A1 | 5/2004 | Kang et al. | |
| 2004/0104261 A1 | 6/2004 | Sterrett et al. | |
| 2004/0104470 A1 | 6/2004 | Bang et al. | |
| 2004/0106294 A1 * | 6/2004 | Lee et al. ................ 438/691 | |
| 2004/0115866 A1 | 6/2004 | Bang et al. | |
| 2004/0145054 A1 | 7/2004 | Bang et al. | |
| 2004/0166662 A1 | 8/2004 | Lei | |
| 2004/0217455 A1 * | 11/2004 | Shiono et al. ................ 257/678 | |
| 2004/0238931 A1 | 12/2004 | Haba et al. | |
| 2004/0238934 A1 | 12/2004 | Warner et al. | |
| 2004/0259325 A1 * | 12/2004 | Gan ................ 438/456 | |
| 2005/0017348 A1 | 1/2005 | Haba et al. | |
| 2005/0067681 A1 * | 3/2005 | De Villeneuve et al. ................ 257/678 | |
| 2005/0067668 A1 | 3/2005 | Humpston | |
| 2005/0082653 A1 | 4/2005 | McWilliams et al. | |
| 2005/0082654 A1 | 4/2005 | Humpston et al. | |
| 2005/0085016 A1 | 4/2005 | McWilliams et al. | |
| 2005/0087861 A1 | 4/2005 | Burtzlaff et al. | |
| 2005/0095875 A1 * | 5/2005 | Humpston et al. ................ 438/613 | |
| 2005/0104179 A1 | 5/2005 | Zilber et al. | |
| 2005/0116344 A1 | 6/2005 | Humpston | |
| 2005/0139984 A1 | 6/2005 | Tuckerman et al. | |
| 2005/0142685 A1 | 6/2005 | Ouellet et al. | |
| 2005/0167773 A1 | 8/2005 | Ozawa et al. | |
| 2005/0170656 A1 | 8/2005 | Nasiri et al. | |
| 2005/0189622 A1 | 9/2005 | Humpston et al. | |
| 2005/0189635 A1 | 9/2005 | Humpston et al. | |
| 2005/0205977 A1 | 9/2005 | Zilber et al. | |
| 2005/0236684 A1 | 10/2005 | Chen et al. | |
| 2005/0248680 A1 | 11/2005 | Humpston | |
| 2005/0258518 A1 | 11/2005 | Yang et al. | |

| | | | |
|---|---|---|---|
| 2005/0279916 A1 | 12/2005 | Kang et al. | |
| 2006/0044450 A1 | 3/2006 | Wolterink et al. | |
| 2006/0081983 A1 | 4/2006 | Humpston et al. | |
| 2006/0091488 A1 | 5/2006 | Kang et al. | |
| 2006/0110854 A1 | 5/2006 | Horning et al. | |
| 2006/0141665 A1 | 6/2006 | Mohammed | |
| 2006/0166480 A1* | 7/2006 | Yun et al. | 438/618 |
| 2006/0278997 A1 | 12/2006 | Gibson et al. | |
| 2007/0042527 A1 | 2/2007 | Tuckerman et al. | |
| 2007/0138644 A1 | 6/2007 | McWilliams et al. | |

FOREIGN PATENT DOCUMENTS

| | | |
|---|---|---|
| EP | 0 585 186 A | 3/1994 |
| EP | 828346 | 3/1998 |
| EP | 1 071 126 A | 1/2001 |
| EP | 1 357 741 A | 10/2003 |
| GB | 2392555 | 3/2004 |
| JP | 5047620 | 2/1993 |
| JP | 07-202157 | 8/1995 |
| JP | 11-326366 | 11/1999 |
| WO | 8502283 | 5/1985 |
| WO | WO-85/02283 | 5/1985 |
| WO | 8904113 | 5/1989 |
| WO | WO-89/04113 | 5/1989 |
| WO | 9519645 | 7/1995 |
| WO | WO-95/19645 | 7/1995 |
| WO | WO-97/11588 A1 | 3/1997 |
| WO | WO-02/058233 A | 7/2002 |
| WO | 2004017399 | 2/2004 |
| WO | WO-2004/017399 | 2/2004 |
| WO | 2004023546 | 3/2004 |
| WO | 2004025699 | 3/2004 |
| WO | WO-2004/023546 | 3/2004 |
| WO | WO-2004/025699 | 3/2004 |
| WO | 2004027880 | 4/2004 |
| WO | WO-2004/027880 A | 4/2004 |

OTHER PUBLICATIONS

U.S. Appl. No. 11/284,289, filed Nov. 21, 2005, assigned to Tessera, Inc.

U.S. Appl. No. 11/025,440, filed Dec. 29, 2004, assigned to Tessera, Inc.

U.S. Appl. No. 11/204,680, filed Aug. 16, 2005, assigned to Tessera, Inc.

U.S. Appl. No. 11/300,900, filed Dec. 15, 2005, assigned to Tessera, Inc.

* cited by examiner

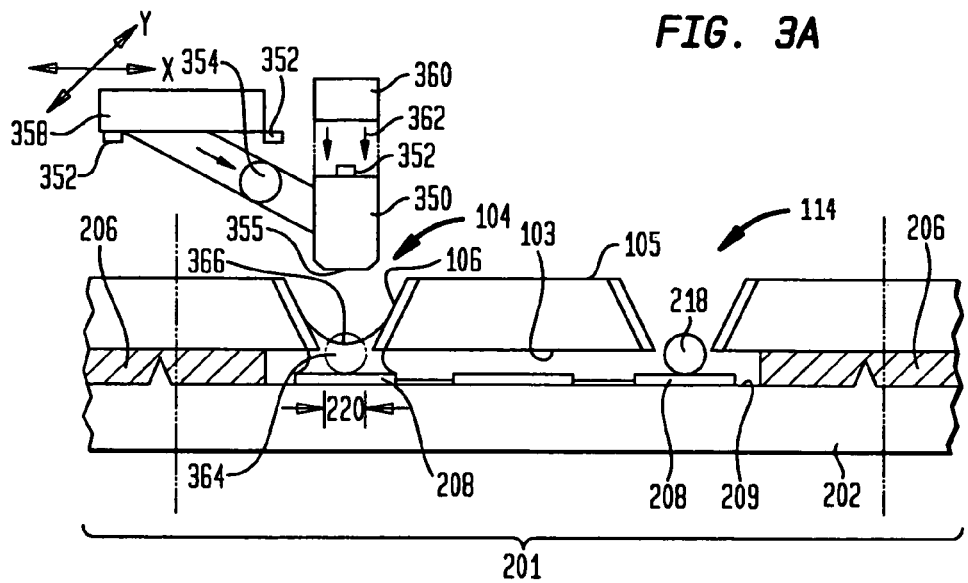
FIG. 3A
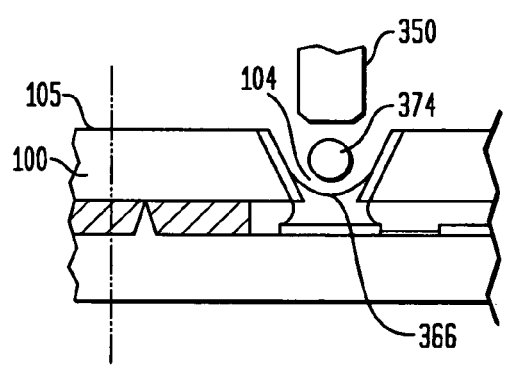
FIG. 3B
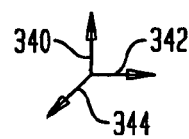
FIG. 3C
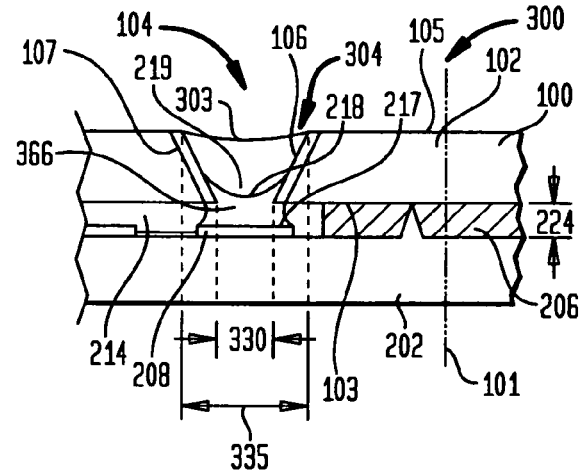
FIG. 3D
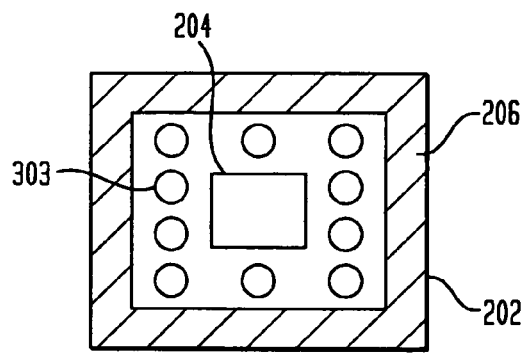

SEQUENTIAL FABRICATION OF VERTICAL CONDUCTIVE INTERCONNECTS IN CAPPED CHIPS

CROSS-REFERENCE TO RELATED APPLICATIONS

The present application is related to the following U.S. Patent Applications and U.S. Provisional Patent Applications: Ser. No. 10/949,575, filed Sep. 24, 2004, Ser. No. 11/121,434, filed May 4, 2005, Ser. No. 10/711,945, filed Oct. 14, 2004, Ser. No. 11/120,711, filed May 3, 2005, Ser. No. 11/068,830, filed Mar. 1, 2005, Ser. No. 11/068,831, filed Mar. 1, 2005, Ser. No. 11/016,034, filed Dec. 17, 2004, Ser. No. 11/284,289, filed Nov. 21, 2005, Ser. No. 10/977,515, filed Oct. 29, 2004, Ser. No. 11/025,440, filed Dec. 29, 2004, Ser. No. 11/204,680, filed Aug. 16, 2005, No. 60/664,129, filed Mar. 22, 2005, No. 60/707,813, filed Aug. 12, 2005, No. 60/732,679, filed Nov. 2, 2005, No. 60/736,195, filed Nov. 14, 2005, and Ser. No. 11/300,900, filed Dec. 15, 2005 (now abandoned), the disclosures of which are incorporated herein by reference.

BACKGROUND OF THE INVENTION

The present invention relates to microelectronic packaging. Microelectronic chips typically are thin, flat bodies with oppositely facing, generally planar front and rear surfaces and with edges extending between these surfaces. Chips generally have contacts on the front surface, which are electrically connected to the circuits within the chip. Certain chips require a protective element, referred to herein as a cap or lid, covering all or part of the front surface. For example, chips referred to as surface acoustic wave or "SAW" chips incorporate acoustically-active regions on their front surfaces, which must be protected from physical and chemical damage by a cap. Micro-electromechanical or "MEMS" chips include microscopic electromechanical devices, e.g., acoustic transducers such as microphones, which must be covered by a cap. The caps used for MEMS and SAW chips must enclose an open gas-filled or vacuum void over the active region of the chip and beneath the cap so that the cap does not touch the acoustical or mechanical elements. Certain electro-optical chips such as optical sensing chips and light-emitting chips have photosensitive elements which also must be protected by a cap or lid. Voltage controlled oscillators (VCOs) sometimes also require a cap to be placed over the active area.

Miniature SAW devices can be made in the form of a wafer which incorporates an acoustically active material such as lithium niobate or lithium tantalate. The wafer is treated to form a large number of SAW devices, and typically is also provided with electrically conductive contacts used to make electrical connections between the SAW device and other circuit elements. After such treatment, the wafer is severed to provide individual devices. SAW devices fabricated in wafer form can be provided with caps while still in wafer form, prior to severing. For example, as disclosed in U.S. Pat. No. 6,429,511 ("the '511 patent"), a cover wafer formed from a material such as silicon can be treated to form a large number of hollow projections and then bonded to the top surface of the active material wafer, with the hollow projections facing toward the active wafer. After bonding, the cover wafer is polished to remove the material of the cover wafer down to the projections. This leaves the projections in place as caps on the active material wafer, and thus forms a composite wafer with the active region of each SAW device covered by a cap.

Such a composite wafer can be severed to form individual units. The units obtained by severing such a wafer can be mounted on a substrate such as a chip carrier or circuit panel and be electrically connected to conductors on the substrate as by wire-bonding the conductors to the contacts on the active wafer. However, this requires that the caps have holes of a size sufficient to accommodate the wire bonding process. This increases the area of the active wafer required to form each unit, requires additional operations and results in an assembly considerably larger than the unit itself.

In another alternative disclosed by the '511 patent, terminals can be formed on the top surfaces of the caps and be electrically connected to the contacts on the active wafer prior to severing the wafer into individual chips. For example, metallic vias are formed in the cover wafer prior to assembly. However, formation of terminals on the caps and vias for connecting the terminals to the contacts on the active wafer requires a relatively complex series of steps.

Similar problems occur in providing terminals for MEMS devices. For these and other reasons, further improvements in processes and structures for packaging SAW, MEMS, electro-optical and other capped devices would be desirable.

SUMMARY OF THE INVENTION

According to an aspect of the invention, a method is provided of forming a capped chip which includes a conductive interconnect extending vertically through a cap thereof. Such method includes providing a cap having an outer surface, an inner surface opposite the outer surface, and a plurality of through holes extending between the outer and inner surfaces. The cap is aligned and joined to a chip having a front face, a device region at the front face and a plurality of bond pads exposed at the front face, the inner surface of the cap facing the front face of the chip. A mass of fusible conductive material is positioned through a first such through hole onto a first such bond pad. The positioned mass is heated to bond the mass to the first bond pad. The steps of positioning and heating the mass form at least a portion of a conductive interconnect extending from the first bond pad at least partially through the first through hole.

In accordance with a particular aspect of the invention, the step of aligning and joining the cap to the chip includes providing a sealing medium between the front face of the chip and the inner surface of the cap, wherein the sealing medium separates the device region from the plurality of bond pads.

In one aspect of the invention, the step of positioning the mass of fusible conductive material includes dispensing a ball-shaped mass of the fusible conductive material, and the fusible conductive material includes at least one material selected from the group consisting of solder, tin and a eutectic composition.

The cap preferably consists essentially of a material which is not wettable by the fusible conductive material and the non-wettable material is exposed at walls of the plurality of through holes such that the step of heating the positioned mass does not wet the wall of the first through hole.

In accordance with one or more further aspects of the invention, the walls of the plurality of through holes extend in a substantially vertical direction perpendicular to the outer face of the cap.

Alternatively, the walls of the plurality of through holes extend at an angle of less than 30 degrees from a direction perpendicular to the outer face of the cap.

In accordance with a particular aspect of the invention, after aligning and joining the cap to the chip, wettable layers are formed on the plurality of bond pads and on walls of the plurality of through holes, wherein the step of heating the positioned mass wets the first bond pad and wets a first wall of the first through hole.

Preferably, prior to aligning and joining the cap to the chip, wettable layers are formed on the plurality of bond pads and on walls of the plurality of through holes, wherein the step of heating the positioned mass wets the first bond pad and wets a first wall of the first through hole.

In accordance with a particular aspect of the invention, the step of positioning the mass includes using a gas to direct the mass towards the first bond pad. Preferably, the step of heating the positioned mass includes directing light from a laser onto the positioned mass until the positioned mass bonds with the first bond pad.

In accordance with one or more preferred aspects of the invention, a second mass of the fusible conductive material is positioned in contact with the bonded mass and heated until the second mass bonds with the previously bonded mass, thereby increasing a height of the conductive interconnect above the first bond pad.

Also in accordance with one or more preferred aspects of the invention, the bond pad is a first bond pad and the mass of fusible conductive material is a first mass. In accordance with a preferred method of forming a capped chip, after the first mass is heated to bond the first mass to the first bond pad, a second mass of fusible conductive material is then positioned through a second through hole of the plurality of through holes onto a second bond pad of the plurality of bond pads. The second mass is then heated such that the heated second mass bonds to the second bond pad. The steps of positioning and heating the second mass form at least a portion of a second conductive interconnect which extends from the second bond pad at least partially through the second through hole.

In a method in accordance with a another preferred aspect of the invention, the mass is a first mass, and the step of positioning the mass includes simultaneously positioning a second mass of the fusible conductive material through a second through hole of the plurality of through holes onto a second bond pad of the plurality of bond pads. In accordance with such aspect, the step of heating the mass includes simultaneously heating the positioned second mass of fusible conductive material, such that the second mass bonds to the second bond pad to form at least a portion of a second conductive interconnect that extends from the second bond pad at least partially through the second through hole.

In such case, preferably, the steps of positioning and heating the first mass, and positioning and heating the second mass are performed sequentially at a time when the chip remains attached to other chips in form of at least a portion of a wafer.

In accordance with one or more further aspects of the invention, the following steps are performed in sequential order for each ith bond pad of the plurality of bond pads. After heating the second mass to bond the second mass to the second bond pad, an ith mass of fusible conductive material is positioned through an ith through hole of the plurality of through holes onto the ith bond pad. The ith mass is then heated, such that the heated ith mass bonds to the ith bond pad. In that way, the steps of positioning and heating the ith mass forms at least a portion of an ith conductive interconnect extending from the ith bond pad at least partially through the ith through hole.

In accordance with one or more preferred aspects of the invention, the inner surface of the cap is spaced from the front face of the chip by a first vertical separation distance and a width of the positioned mass is greater than the first vertical separation distance.

In accordance with a particular aspect of the invention, the step of positioning the second mass includes dispensing the fusible conductive material in a second nominal volume exceeding a first nominal volume of the first mass by more than 20%. Preferably, a width of the first through hole at the inner surface is greater than the vertical separation distance. Alternatively, or in addition thereto, a thickness of the cap between the inner and outer surfaces is greater than a width of first through hole at the inner surface.

According to a particular preferred aspect of the invention, the second nominal volume is dispensed in the step of positioning the second mass by an apparatus which positions and heats the first nominal volume, the second nominal volume being determined by adjusting the apparatus according to at least one of a width of the second through hole and a vertical separation distance between the inner surface of the cap and the front surface of the chip at the second through hole.

A method of fabricating a microelectronic device in accordance with another aspect of the invention includes (a) assembling a cap element with a wafer element having a front face including a plurality of regions, each such region including an active area and a plurality of bond pads exposed at the front face outside of the active area. The cap element is positioned such that it overlies the front face of the wafer element. The cap element in such microelectronic device has a plurality of openings which extend from an outer surface of the cap element to an inner surface of the cap element. Then, (b) a first mass of fusible conductive material is positioned and bonded through a first opening of the plurality of openings onto a first bond pad of the plurality of bond pads, and (c) a second mass of fusible conductive material is positioned and bonded through one or more of the plurality of openings. In a further step (d), these steps (b) and (c) are repeated a plurality of times and then (e) the wafer element and the cap element are severed along severance lines to thereby form a plurality of capped units, the capped units including a plurality of conductive interconnects, the conductive interconnects including the first and second bonded masses.

In accordance with a particular aspect of the invention, the steps (b) and (c) are performed sequentially to the first bond pad and to a second bond pad of the plurality of bond pads.

Alternatively or in addition thereto, the steps (b) and (c) are performed sequentially to bond the second mass through the first opening to the first mass to form stacked masses including the first mass and the second mass bonded to the first mass.

In accordance with a particular preferred aspect of the invention, each of the steps (b) and (c) are performed simultaneously to the first bond pad and to a second bond pad of the plurality of bond pads using a tool which heats the first mass individually to cause the first mass to bond to the first bond pad and using a tool which heats the second mass individually to cause the second mass to bond to the second bond pad.

Preferably, each of the steps (b) and (c) are performed simultaneously to the first bond pad and to a second bond pad of the plurality of bond pads by providing a combined mass of the fusible material including the first and second masses to a combined opening in which the first and second bond pads are exposed. The combined mass is caused to melt and simultaneously bond to the first and second bond pads. In such case, the step (e) of severing the wafer element and the cap element severs the combined mass to form a first conductive interconnect extending from the first bond pad of a first chip and a second conductive interconnect extending from a second bond pad of a second chip.

In accordance with another aspect of the invention, a device includes a chip having a front face, the front face having a plurality of peripheral edges. The chip includes an active region and a plurality of bond pads exposed in a bond pad region at the front face. A cap overlies the front face. The cap has an inner surface facing the front face, an outer surface opposite the inner surface, and a plurality of through holes which extend between the inner and outer surfaces. The cap is mounted to the chip and spaced from the chip to define a void. A plurality of electrically conductive interconnects, each including a fusible conductive material, are bonded to the plurality of bond pads. The conductive interconnects extend at least partially through the through holes. In addition, the plurality of electrically conductive interconnects include stacked columns of two or more masses of the fusible conductive material in ones of the plurality of through holes.

In accordance with one or more particular aspects of the invention, the device further includes a seal extending between the cap and the chip over a portion of the chip between the active region and the bond pad region. For example, the seal may extend to outer portions of the front face extending between the bond pad region and the peripheral edges.

An assembly in accordance with another aspect of the invention includes a device including a capped chip having electrically conductive interconnects as described herein and further includes a substrate having a front surface and one or more terminals exposed at the front surface. The front face of the chip faces toward the front surface of the substrate and stacked columns of two or more masses of the fusible conductive material are bonded to the one or more terminals of the substrate.

Preferably in accordance with such aspect, the substrate includes a dielectric element and a plurality of metal wiring patterns exposed at the front surface. For example, the dielectric element can include at least one material selected from the group consisting of BT resins, FR-4 composites, epoxies, ceramics, polyimide or glasses.

A microelectronic assembly in accordance with another aspect of the invention includes a microelectronic device including a capped chip and a circuit panel having terminals bonded to the microelectronic device. The microelectronic device includes (a) a chip having a front surface and a rear surface. The front surface includes an active region and a plurality of contacts exposed at the front surface outside of the active region. In addition, (b) a cap overlays the front surface of the chip, the cap having an inner surface adjacent to the front surface, an outer surface remote from the inner surface and edges bounding the cap. At least one of the edges includes one or more outer portions and one or more recesses extending laterally inward from the outer portions such that the contacts are aligned with the recesses and exposed within the recesses. The microelectronic device further includes (c) a plurality of conductive interconnects bonded to the contacts, with the conductive interconnects extending from the contacts in a direction towards the outer surface. The circuit panel has a first surface and a plurality of terminals exposed at the first surface that are bonded to the contacts of the chip through the conductive interconnects. The microelectronic device is positioned in such way that the outer surface of the cap faces the first surface of the circuit panel.

In accordance with a preferred aspect of the invention, the conductive interconnects may include masses of a fusible conductive material bonded to the contacts. According to a particular aspect, the masses are first masses, and the microelectronic device further includes second masses of a fusible conductive material. The second masses are bonded to at least some of the first masses of fusible conductive material to form stacked masses, such that at least some of the conductive interconnects include the stacked masses.

In accordance with one or more preferred aspects of the invention, the conductive interconnects include stud bumps bonded to the contacts and a flowable conductive medium bonding the stud bumps to the terminals. In a particular embodiment, the flowable conductive medium includes a fusible conductive medium, which may be, for example, a conductive adhesive.

As used herein in relation to a cap and cap wafer, the terms "top surface" and "outer surface" refer to an outer exterior-facing surface of the cap, and the terms "bottom surface" or "inner surface" refer to an inner, inwardly-facing surface of the cap, referring to the manner in which the cap is joined to the chip. Stated another way, the outer surface of the cap faces away from the front, i.e., the contact-bearing surface of the chip, while the inner surface of the cap faces towards the front or contact-bearing surface of the chip. Thus, the outer surface of the cap is referred to as the top surface, and the inner surface of the cap is referred to as the bottom surface, even if the capped chip structure including both chip and cap is turned over and mounted, such that the top surface faces downwardly and is joined to another article, such as a circuit panel.

BRIEF DESCRIPTION OF THE DRAWINGS

FIGS. 1-3D including sectional views 1, 2A and 3A-3C and plan views 2B and 3D illustrate stages in fabrication of capped chips having sequentially formed vertical conductive interconnects in accordance with an embodiment of the invention.

DETAILED DESCRIPTION

As noted previously, the following U.S. Patent Applications and U.S. Provisional Patent Applications are incorporated herein by reference: Ser. Nos. 10/949,575, filed Sep. 24, 2004, 11/121,434, filed May 4, 2005, 10/711,945, filed Oct. 14, 2004, 11/120,711, filed May 3, 2005, 11/068,830, filed Mar. 1, 2005, 11/068,831, filed Mar. 1, 2005, 11/016,034, filed Dec. 17, 2004, 11/284,289, filed Nov. 21, 2005, 10/977,515, filed Oct. 29, 2004, 11/025,440, filed Dec. 29, 2004, 11/204,680, filed Aug. 16, 2005, 60/664,129, filed Mar. 22, 2005, 60/707,813, filed Aug. 12, 2005, 60/732,679, filed Nov. 2, 2005, 60/736,195, filed Nov. 14, 2005 and the commonly owned U.S. patent application Ser. No. 11/300,900, filed Dec. 15, 2005 (now abandoned) entitled "STRUCTURE AND METHOD OF MAKING CAPPED CHIP HAVING DISCRETE ARTICLE ASSEMBLED INTO VERTICAL INTERCONNECT."

Among embodiments of the invention described herein, capped chips having conductive interconnects are formed in which a fusible conductive material, e.g., solder, tin or eutectic composition is supplied through an opening (a through hole and/or recess) of the cap to a bond pad of the chip. A tool positions a mass of the fusible conductive material within a particular opening and then heats the mass of material to a bonding temperature. The fusible conductive material bonds to a bond pad of the chip and extends at least partially through the opening. In a particular embodiment, the fusible conductive material bonds to other structure when present, as well, such as to a wettable lining provided within the opening.

FIGS. 1-3D illustrate a capped chip as a portion of a wafer having a cap element assembled thereto. FIGS. 1-3D also illustrate stages in a method for fabricating a capped chip according to an embodiment of the invention. In particular, FIG. 3C is a sectional view illustrating a capped chip 300 as a portion of a capped wafer and FIG. 3D is a top-down plan view illustrating an interconnect 303 and the seal 206 provided on the surface of a chip 202 included in the capped chip.

Particular types of devices, such as SAW devices and MEMs need to be sealed hermetically in order to function appropriately over the life of the device. Contact with substances, even de-ionized water, can cause the frequency of SAW devices to change. For many silicon semiconductor devices, a package is considered to be hermitic if it has a leak rate of helium below $1 \times 10^{-8}$ Pa m$^3$/sec. Other devices such as electro-optical devices do not require hermeticity, but nevertheless are best packaged with a protective lid which is at least somewhat optically transmissive, the lid covering the optical device to prevent particles from reaching a surface of the electro-optical device.

Figure 1:
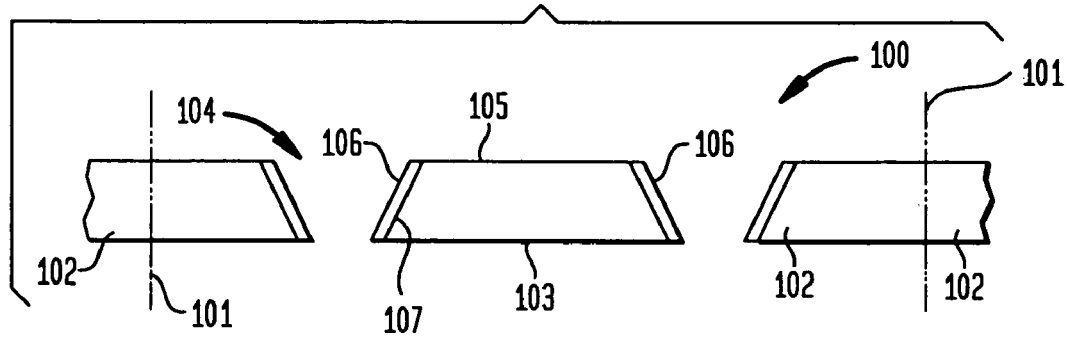
Figure 2A:
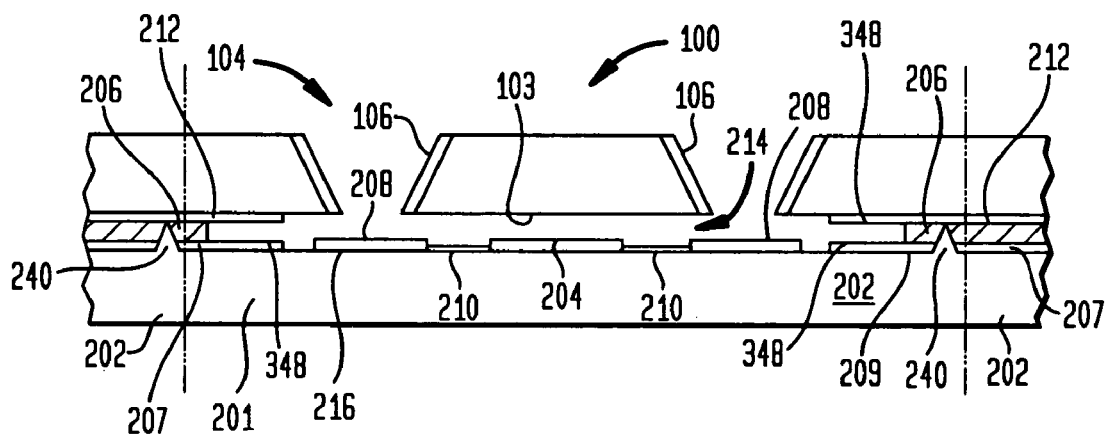

Referring to FIG. 1, in a method of forming such capped chips, a plurality of caps 102 are attached together at boundaries 101 within a multiple cap-containing element 100 or cap wafer. The cap wafer 100 is simultaneously mounted to a plurality of chips 202 (FIG. 2A). The chips themselves may be contained in a single wafer 201 or a plurality of chip-containing wafers. After joining the cap wafer to the chip wafer, the chips are severed to form a unit 300, as best seen in FIG. 3C.

With continued reference to FIG. 1, the cap element 100 can be either rigid or somewhat flexible, and a variety of materials are available for its construction. In one embodiment, when the area of the cap element 100 and the chips to be joined are fairly large, the cap element 100 consists essentially of one or more materials or a composition of materials which has a coefficient of thermal expansion (hereinafter "CTE") similar to that of the chips that are to be capped. For example, the cap element 100 may include or consist of one or more materials such as ceramics, metals, glasses and semiconductor materials which preferably are expansion-matched to silicon. When the chips are provided on a silicon wafer or other such semiconductor wafer having a relatively low CTE, the cap element 100 preferably consists essentially of one or more CTE-matched materials such as silicon or other semiconductor material, aluminum, nickel alloys, iron and alloys of nickel and cobalt. Another suitable material having a CTE matching that of silicon is borosilicate glass.

Referring to FIG. 2A, when the device region 204 includes a SAW device, the cap element is desirably constructed of a material having a CTE which is matched to that of the SAW device. For example, when the chip includes a SAW device fabricated in a wafer including lithium tantalate material, a preferred material for the cap element is aluminum, because aluminum has a CTE which is similar to that of SAW devices. Aluminum also a low modulus of elasticity, and aluminum can be oxidized to form an insulating surface oxide of aluminum by processes such as "anodizing". By formation of such oxide, insulating layers are formed on the top surface and bottom surface of the cap. Any openings such as through holes in the cap can also be insulated by formation of such oxide. For example, such oxide can be used to isolate respective ones of electrical interconnects which extend through such through holes.

As further shown in FIG. 1, the cap element 100 and each cap 102 thereof has a top surface 105 and a bottom surface 103. In the embodiment shown, the top and bottom surfaces define respective planes. Through holes 104 are provided in the cap element 100, generally at a rate of one or more through holes per cap 102. The through holes are formed by any technique suited for the particular material or materials of which the cap element is made. For example, when the cap element 100 is composed predominantly of silicon, metal, ceramics and glasses, the through holes can be provided by a subtractive process such as etching or drilling. Alternatively, when the cap element 100 includes a polymer, the through holes are preferably formed in a process by which the cap element is initially formed, as by molding. In the embodiment shown in FIG. 1, the cap element 100 consists predominantly of a dielectric or semiconductor material such as a glass, ceramic or a silicon wafer. Typical etching methods applied to wafers of such materials result in through holes which are tapered as shown to grow smaller from one surface towards the other surface, such that they have a substantially frusto-conical shape. In the embodiment shown in FIG. 1, the through holes 104 are tapered to become smaller in a direction from the top surface towards the bottom surface.

As further shown in FIG. 1, bonding layers, i.e., wettable regions 106, wettable, illustratively, by a fusible medium such as solder, tin, or a eutectic composition, are provided on the sidewalls 107 of the through holes 104. The tapered profile of the through holes generally assists in permitting the wettable regions to be formed on the sidewalls 107 of the through holes 104 by deposition. Suitable bonding layers will vary with the material of the cap element and the fusible material which is used to form the bond. The particular fusible medium may affect the impedance characteristics of the bond that is formed. One exemplary bonding layer for use with a fusible medium such as a low-melting point tin-based solder and a cap element 100 consisting essentially of semiconductor, ceramic or glass, includes a 0.1 µm thick layer of titanium overlying the sidewalls of the through holes 104, an additional 0.1 μm thick layer of platinum overlying the titanium layer, and a 0.1 μm thick exposed layer of gold overlying the platinum layer. A variety of metals in a variety of layered structures may be deposited to provide such wettable layers. Typically, one or more layers of metal are deposited onto the walls of the through holes and bond pads, e.g., via vapor deposition and/or electroless plating and/or electroplating. Examples of metals which can be deposited first on the cap element as an adhesion layer include, but are not limited to the following: chromium, titanium, vanadium, titanium-tungsten, and layered structures of metal including a layer of titanium followed by a layer of copper, a layer of titanium followed by a layer of chromium and then followed by a layer of copper. A final layer of a noble metal such as gold is then deposited as an outermost layer to protect the layered structure from corrosion. Thus, a layer of nickel followed by an outermost layer of gold can be provided. Silver can sometimes be used instead as the final metal because, although silver corrodes, silver oxide is conductive. As an alternative to providing such final noble metal, an organic solderability preservative can be deposited to overlie the wettable layer previously formed on the walls of the through holes and the bond pads. In a particular example, when the fusible material is a lead-free solder, the wettable bonding layer can include a layer of nickel followed by a layer of copper. In another example, when the fusible material includes a eutectic composition, preferably a layered structure of chromium followed by nickel and then gold is provided.

As shown in FIG. 2A, the cap element 100 is aligned to a plurality of attached chips 202, such as contained in a device wafer 201 or portion of a device wafer. An inner surface 103 of the cap element 100 is preferably spaced from the front surface 209 of the chip 202 so as to define a gas-filled void or vacuum void 214 between the cap element 100 and the chip 202. The device region 204 of each chip 202 is conductively connected by wiring 210 to bond pads 208 disposed in a bond pad region at the front surface 209 of each chip.

A sealing medium or sealing material 206 seals the cap element 100 to the device wafer 201. Illustratively, the sealing material 206 includes, an adhesive, a glass, especially a low-melting point glass, a fusible material such as solder, or another material which is capable of forming a diffusion bond. For example, the sealing material may be a fusible material such as solder which wets an exposed surface of a bonding element 207 and forms a strong bond thereto by diffusion of materials between the fusible material and the bonding element. The bonding element 207 is preferably a ring-like wettable metallic feature which surrounds the bond pads 208 on the front surface 209 of the chip 202. When the bonding medium is a fusible material, e.g., a solder, tin or eutectic composition, the bonding element 207 is preferably disposed in registration with a like or similar bonding element 212 provided on an inner or "bottom" surface 103 of the cap element 100. Alternatively, the sealing material can extend throughout the region occupied by the bond pads such that each conductive interconnect is individually and completely surrounded by the sealing material and the sealing material extends to the perimeter of the device region 204 of the chip. When the sealing material is a fusible material, the seal forms when the inner surface 103 of the cap element 100 and the front surface 209 of the chip containing wafer 202 are drawn together by the decreasing height of the fusible material as it cools and freezes into final form.

Alternatively, the sealing material 206 can include one or more materials such as thermoplastics, adhesives, and low melting point glasses. A low melting point glass can be used to bond the inner surface 103 of the cap element 100 directly to a front surface 209 of the wafer 201 containing chips 202, without requiring intervening metallizations such as the above-described bonding elements to be provided on opposing surfaces of the device wafer 201 and the cap element 100. In one embodiment, the device region 204 includes a SAW device, and the sealing material is disposed in an annular or ring-like pattern in a way that surrounds the bond pads 208 and the device region 204 to hermetically seal each cap 102 to each chip 202. The capped chip optionally includes a guard ring 348 which is used to prevent the sealing material from flowing beyond the wettable seal ring layer towards the device area 204 of the chip 202. The guard ring presents a surface which is not wettable by the sealing material. Certain materials present nonwettable surfaces to other materials. For example, polytetrafluoroethylene (PTFE) presents a surface to which most other materials will not adhere or wet. In one embodiment, the guard ring 348 includes PTFE as a material at the exposed surface thereof. A similar seal ring layer and guard ring are optionally provided on the inner surface 103 of the cap element 103.

Preferably, bottom surface 103 of the cap element 100 is vertically spaced from the front surface of the device wafer 201 by stand-offs 240 which protrude from the front surface of the device wafer 240. Alternatively, such stand-offs can be incorporated in the cap element 100 and protrude downward from the inner surface 103 of the cap element 100. The stand-offs 240 are used to establish and maintain a vertical spacing between the cap inner surface of the cap that is joined to each chip in order to assure that a gas-filled or vacuum void 214 overlying the device region 204 has sufficient height for device function. Stand-offs could also be separate elements distributed throughout the seal medium and contained within its thickness.

Figure 2B:
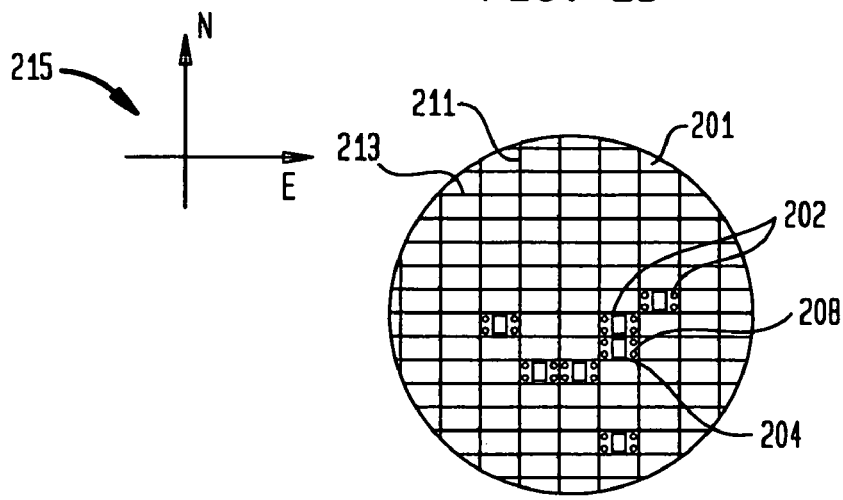

The device wafer 201 is shown in plan view in FIG. 2B. Illustratively, the wafer is one of many available types of wafers which include at least a layer of semiconductor material. Illustratively, the device wafer may include one or more semiconductors such as silicon, an alloy of silicon, another group IV semiconductor, a III-V compound semiconductors or a II-VI semiconductor. Each chip 202 includes a semiconductor device region 204 containing, for example, one or more active or passive devices formed of the semiconductor material of the chip. Examples of such devices include, but are not limited to a microelectronic or micro-electromechanical device such as a SAW device, MEMS device, voltage-controlled oscillator ("VCO"), etc., and an electro-optic device. The bond pads 208 of each chip 202 are shown in FIG. 2B. With respect to the plan view of the device wafer 201 shown in FIG. 2B which is directed towards its front surface 209 (FIG. 2A), the term "vertical" means an at least generally "north-south" direction in accordance with the directions indicator 215 shown in FIG. 2B, such direction being generally within or parallel to the plane which corresponds to the major surface or "front" surface 209 of the device wafer. By contrast, the term "horizontal" means a direction within or parallel to the plane of the front surface 209 and which is transverse to the "north-south" direction. The horizontal direction is typically in an "east-west" direction according to indicator 215 and is orthogonal to the "north-south" direction. However, the east-west direction need only be a direction within or parallel to the front surface 209 which lies at an angle from the north-south direction.

With continued reference to FIG. 2B, each chip 202 is severable from other chips of the device wafer by severing the wafer along vertical dicing channels 211 and along horizontal dicing channels 213, a process known as "dicing". In a preferred embodiment, each chip are not severed from other chips of the device wafer 201 until steps are completed by which a cap element 100 is bonded to the device wafer and conductive interconnects are formed which extend from the bond pads 208 of chips through the through holes in respective caps 102 of the cap element.

FIGS. 3A-3C are sectional views illustrating further stages of fabrication in which electrically conductive interconnects 303 (FIG. 3C) are formed which extend from the bond pads 208 of each chip 202 into through holes 104. As shown in FIG. 3A, an embodiment is shown in which an inner surface 103 of a cap element 100 is sealed by a sealing material 206 to the front surface 209 of a device wafer 201. In this embodiment, the bond pads 208 include solder-wettable regions which are exposed at the front surface 209 of the chip. As further illustrated in FIG. 3A, a process is performed for dispensing a fusible conductive material and heating it to bond the fusible material to the bond pads and wettable regions 106 lining the walls of the through holes.

Referring to FIG. 3A, a tool 350 is movable above the top surface 105 of the capped wafer. Illustratively, the tool can be a wafer bumping tool such as provided by Pac Tech USA Inc. having a place of business at Santa Clara, Calif. The tool is capable of precise movement in x and y horizontal directions, preferably under control of a software program. Preferably, one or more optical sensors 352 is mounted to the tool for guiding its movement to a selected position of the capped wafer. The tool 350 performs a process of positioning a mass of a fusible conductive material, e.g., a solder ball 354 or "solder sphere" within a through hole and then heating the solder ball to a temperature at which it then bonds to a bond pad of the chip. Attached to the tool 350 is preferably a "singulation unit" 358 for the purpose of directing a solder ball into the head of the tool 350 at an appropriate time to be bonded to the capped wafer. The singulation unit can either carry a supply of pre-formed solder balls or form each solder ball just prior to the time that it is positioned and bonded to the capped wafer.

The solder ball is positioned by a process which directs the pre-formed solder ball through an outlet or nozzle 355 of the tool towards the bond pad 208 of the chip. The nozzle 355 ejects the solder ball in a direction towards the bond pad using a gas emitted from the nozzle such that it preferably comes to rest on the bond pad 208. The position of the solder ball after it comes to rest on the bond pad 208 is shown by the dotted outline at 364. The gas ideally consists essentially of one or more inert, nonreactive or low reactivity gases, considering the materials of the chip and other components of the capped wafer. The gas preferably consists essentially of nitrogen, but noble gases such as helium, argon and neon and other gases can be used which are considered to have relatively low rates of reaction at temperatures at which solder or other fusible material bonds to materials that they wet. In a particular embodiment, a coating of flux is applied to the solder ball prior to or at the time that the ball is ejected from the nozzle. In such embodiment, the flux helps the solder ball to stick to the bond pad so that the ball is positioned properly for the bonding process which follows.

Next, the solder ball is bonded to the bond pad by highly localized heating. Ideally, this step should heat the solder ball and the surface of the bond pad to an attach temperature and be done without imparting a great amount of the heat to the device wafer of the cap wafer mounted thereto. A laser is capable of imparting heat to the solder ball in an appropriately localized manner. Ideally, a laser 360 is mounted to the tool 350 for directing its energy in a columnar direction 362 of the tool towards the solder ball. The nozzle 355 may further include focusing apparatus such as a lens for the purpose of spreading the energy of the laser beam over the width of the solder ball and/or for concentrating the energy at a particular distance from the nozzle which coincides with the vertical distance of the solder ball in a columnar direction 362 from the nozzle 355. Upon melting the solder ball, the solder therein spreads over the exposed surface of the bond pad 208 until the bond pad is completely covered. In addition, the solder of the solder balls flows onto, upward and downward along the wettable lining 106 of the through hole until the tendency for the solder to spread is balanced by the surface tension and gravity which pulls in a downward direction on the solder.

The two-step process of positioning a mass of fusible conductive material, e.g., a solder ball, and then bonding that mass to the chip is preferably performed sequentially, one bond pad after another for each of the bond pads of the capped wafer. Illustratively, after forming a conductive interconnect by steps including positioning the solder ball within through hole 104 and bonding it, the nozzle 355 of tool 350 is moved to another position above through hole 104 and these steps are repeated to form a conductive interconnect within that through hole. Of course, the sequential nature of these operations does not preclude the use of several tools 350 in parallel to fabricate multiple conductive interconnects simultaneously on one capped wafer. Simultaneous fabrication is possible when each of the multiple tools has appropriate geometry and instrumentation to be simultaneously guided to the multiple locations on the wafer for simultaneous processing. An advantage of processing each bond pad of the chip individually by a tool is that the tool need not be custom and precision milled to the requirements (pitch and through hole size) of the capped wafer. These parameters are preferably adjustable by software used to control the movement and operation of the tool (or each tool in the case of multiple simultaneously active tools).

However, for particular applications, as when the commercial success of a chip in large quantities is assured, a cost advantage can be achieved by providing a cluster of such tools 350 which are capable of simultaneously performing the above-described processing to two or more bond pads. In a particular example, a row, a column, or portion of a row or portion of a column of exposed bond pads are processed simultaneously by a tool. In another example, multiple rows or columns or portions thereof are processed simultaneously. In such case, the tool cluster must have a capability of maintaining precise spacings between individual locations of the capped wafer processed thereby.

In the embodiment illustrated in FIG. 3A, the mass 366 of solder or other fusible material that results after positioning and bonding the solder ball does not completely fill the through hole 104. Rather, the height of the mass 366 within the hole might only be barely above the inner surface 103 of the cap element. The mass 366 serves to seal the through hole to protect the device region 204 against contaminants. However, for certain applications, a conductive interconnect which includes the mass 366 may need to have greater height within the through hole. In such case, the mass 366 is considered only an initial or first mass. It may be necessary to position and bond a further or second solder ball to the mass in order to complete the conductive interconnect. The tool 350 is capable of positioning an additional solder ball within the through hole and locally heating the additional solder ball to cause it to fuse to the pre-existing solder mass in the hole.

FIG. 3B illustrates such case in which a further solder ball 374 is ejected from the tool 350 into the through hole 104 in order to increase the height of the conductive interconnect.

FIG. 3C illustrates the capped wafer after the second solder ball has been positioned within the through hole by tool 350 and heated to a temperature at which the second solder ball softens or melts. In such manner, a second mass 219 is formed overlying the top surface 218 of the first mass 366 and fused to the solder-wettable lining 106 at the wall of the through hole. During the bonding process, the second mass 219 preferably fuses to the top surface 218 of the first mass to form one solid mass of solder. As shown in FIG. 3C, a seam appears between the first and second masses of solder at the top surface 218 of the first mass. The seam may result when the localized heating provided by the tool 350 is insufficiently generalized to completely melt the second mass 219 into the first mass. However, it is not required to eliminate the seam. A good conductive interconnect is produced whether or not a seam is present between the first and second masses of fusible conductive material so long as there is good conduction from the bond pad up through the fusible material of the conductive interconnect.

As seen in FIG. 3C, positioning and bonding of the second mass of fusible material has now raised the top surface 303 of the conductive interconnect to a level reaching that of the top surface 105 of the capped wafer. The height that the conductive interconnect reaches depends upon the total volume of the through hole plus the volume of the interconnect between the cap wafer and the device wafer, in relation to the amount of fusible material provided thereto for the formation of the interconnect. Further, the geometry of the through hole, i.e., its height to width aspect ratio, influences the size of the solder ball that can be positioned and bonded in each cycle. When the aspect ratio is low, one solder ball placed on the bond pad and bonded thereto may provide enough fusible material to fill the through hole. On the other hand, when the aspect ratio is relatively high, multiple solder balls may need to be positioned by the tool and bonded therein to produce the conductive interconnect having the desired height.

FIG. 3C illustrates an embodiment in which each individual bond pad is not totally surrounded by the seal medium. Therefore, the combined mass 304 of fusible conductive material formed by the first mass 366 and second mass 219 separates the void 214 sealed by the cap from the medium, e.g., air, or other gaseous or liquid medium which is present above the exterior surface 105 of the conductive interconnect. Thereafter, the assembly formed by the cap element 100 and the wafer 201 is severed by sawing along dicing lanes defining boundaries between individual capped chips 300, such as at boundary 101 between two such capped chips 300 shown in FIG. 3C.

The top-down plan view of FIG. 3D further illustrates features on the surface of the chip 202 as completed in an assembly including a capped chip, the illustrated features including the device area 204 of the chip 202, the interconnects 303 which are joined to bond pads of the chip, and a ring seal 206 which is disposed as an annular "ring" or preferably square-shaped "picture-frame ring" structure that surrounds the bond pads and the device area 204 of the chip 202.

Optionally, various stages of the above-described processing can be performed in different facilities because the required cleanroom level, i.e., a level specifying the maximum concentration of contaminating particles in the air and on surfaces of the facility, varies during the stages of processing. Moreover, some of the stages of processing are best performed in facilities which are oriented to performing certain steps of processing. In a preferred embodiment, testing is performed on the results of intermediate stages of processing to eliminate product and materials from the process stream which the testing determines to be defective.

Thus, with respect to the processes described in the foregoing, a facility can fabricate cap elements, e.g. cap wafers having dimensions sized to fit the chip-containing device wafers to be covered thereby. As an example, such cap elements are fabricated from blank wafers, which can be either new wafers or possibly wafers recycled from previous processing. The cap elements are subjected to processing to form the through holes, which are then tested to assure conformance to standards of quality, e.g., placement, location, alignment, pitch, depth, sidewall angle, etc., and any of several other criteria for assuring quality. In either the same facility or a different facility, processing may then proceed with the formation of wettable regions disposed on sidewalls of the through holes, e.g., regions having one or more metallic layers referred to as "under bump metallizations" ("UBMs") having an exposed outer surface adapted to be wetted by solder or other fusible material. Because of the techniques used, and the increased sizes of features of the cap element, and tolerances therefor, these particular steps can be performed in facilities which need not be geared to the fabrication of semiconductor devices. However, there is no constraint against performing such steps in a semiconductor fabrication facility, if desired. At the conclusion of this processing, testing is optionally performed to assure that the wettable regions of the cap element meet quality standards.

Thereafter, the cap element and the chip-containing wafer are joined together according to processing such as described above with reference to FIG. 2A, such joining process preferably being performed in a facility having a high cleanroom level. For example, such process is desirably performed in a semiconductor fabrication facility, which can be the same facility in which the device wafer which contains the chips is made. When the chips include optically active elements such as imaging sensors, processing to complete the conductive interconnects 303 (FIG. 3C) of each cap element can be deferred until later processing, if desired, since the primary concern is to mount the cap element as a cover over the chip wafer to avoid dust contamination. However, if the chip contains a SAW device, MEMs device or other such device requiring hermetic packaging, it is desirable to form the conductive interconnects 303 when the cap is first joined to the device wafer, to form a seal which protects the SAW device during subsequent stages of processing. Again, some testing is then desirably performed to assure that quality standards are met prior to proceeding to subsequent stages of fabrication. In chips that do not require hermetic sealing, subsequent processing can be conducted later to form the electrical interconnects and to provide any further sealing that is needed. Such processing can be performed in another facility other than the semiconductor fabrication facility, and at a cleanroom level that is not required to be as high as that of a semiconductor fabrication facility.

The mounting of a cap element to a chip wafer, as described in the foregoing, is especially advantageous for the packaging of certain types of chips, especially those including SAW devices, MEMs devices, and optical devices, potentially resulting in increased yields, due to the ability of such processing to be performed efficiently in cleanroom environments of semiconductor fabrication facilities, where sources of contamination are kept to a minimum. In particular, it is especially desirable to protect chips which include imaging sensors such as charge-coupled device (CCD) arrays and CMOS PN arrays and the like from dust or other particle contamination by attaching a cap or lid to the front surface of the chip, as early in the packaging process as possible. Such imaging sensors include an imaging device array of a chip, over which a layer including an array of bubble-shaped microlenses is formed in contact with the device array. The array of microlenses typically includes one microlens per pixel unit of the device array, the pixel unit having dimensions of a few microns on each side. In addition, such microlenses are often made of a sticky material to which dust tends to adhere after manufacture. An example of a material used to fabricate microlenses is paralyene. Particles and dust, if allowed to settle directly on an imaging sensor, can obscure a portion of the pixel area of the imaging sensor, causing the image captured by the sensor to exhibit a black spot or degraded image.

However, owing to the shape of the microlenses and their number, and the sticky nature of the material used to make them, it is virtually impossible to remove dust or other particles that settle on the surface of a typical imaging sensor having such microlenses. Thus, any particles which settle on the imaging sensor at any time after the microlens array is formed, such as during the packaging or dicing processes, render the imaging sensor defective, such that it must be discarded. This provides an explanation why such imaging sensor chips, when packaged according to conventional chip-on-board techniques, exhibit a yield rate in the final packaged chips, which is only 80% to 85% of the chips fabricated on each wafer that initially test good.

On the other hand, particles and dust which settle on a transparent cap or cover above the outer surface of the chip do not obscure a portion of the image because the outer surface of the cap lies outside of the focal plane of the device. At worst, particles settling on the cover result in slightly decreased light intensity striking a portion of the imaging sensor. The slightly decreased light intensity rarely affects the quality of the image captured by the imaging sensor. Moreover, as described herein, the caps or covers can be mounted over the imaging sensors of the chips while the chips remain attached in wafer form, i.e., before the wafer is diced into individual chips. The mounting of the caps is preferably performed in substantially the same level of cleanroom environment as that used to fabricate the wafer, e.g., before the chip wafer leaves the semiconductor fabrication facility. In such manner, dust and particles are prevented from ever reaching the surface of imaging sensors of the chips. Moreover, once the chips are protected by such transparent caps, it becomes possible to clean the top surfaces of the covers if particles such as dust reach them. This is because the transparent caps can be made substantially planar, unlike the topography of the bubble-shaped microlenses of the imaging sensor, and are typically made of a material such as glass, which is readily cleaned by a solvent. Because the potential for direct dust contamination of the imaging sensor is virtually eliminated once the transparent cap wafer is mounted to the chip wafer, it is estimated that imaging sensor chips which are provided with transparent covers early in the packaging cycle have a yield rate of 97%-99%. In such case, the defect rate becomes no longer primarily due to contamination of the imaging sensors, but rather, for other reasons such as electrical functionality.

Desirably, wafer-level testing is performed on the chip-containing wafer 201 (FIG. 3C) prior to the cap element 100 being joined to the wafer 201 and the conductive interconnects 304 formed thereto. "Wafer-level testing" refers to such testing as is generally performed on chips, prior to the chips being severed into individual chips. More extensive testing, commonly referred to as "chip-level testing", is typically performed only after the chip has been severed from the wafer and packaged as an individual chip.

Wafer-level testing typically tests for basic functionality, such as for electrical continuity, and basic functional operation of each chip. Such testing is desirably performed prior to individually packaging each chip, in order to eliminate the costs of packaging chips that are later determined to be defective. Thus, it is desirable to perform steps to complete the packaging of chips only with respect to chips which have passed initial wafer-level testing, i.e., "known good dies". By completing the packaging only as to "known good dies", unnecessary packaging operations and/or rework of packaging operations are avoided.

Wafer-level testing generally takes much less time, perhaps as much as 100 times smaller amount of time per chip tested than chip-level testing. However, the cost per chip of wafer-level testing performed by equipment capable of mechanically probing the surface of the wafer can equal or exceed that of the cost of chip-level testing, despite the greater amount of time per chip needed to perform chip-level testing. The special equipment required to precisely mechanically probe the contacts on the wafer surface is very expensive. For that reason, such special equipment is typically also subject to resource constraints within the manufacturing facility. Moreover, fewer contacts per chips are capable of being simultaneously contacted by such equipment than is generally the case for chip-level testing, for which chips are generally placed in sockets for testing. Another factor that affects the cost of wafer-level testing is that the special equipment used to probe the contacts of the wafer is limited to testing a single chip at a time, to at most a few chips at one time.

On the other hand, chips that are processed into capped chips in wafer form or lidded chips in wafer form, as described herein, e.g., in FIGS. 1-3D, are capable of being tested at the wafer level, with test equipment that is potentially less expensive than the mechanical probing equipment described above, because interconnects of the chips are disposed on the top surface of the cap wafer and for that reason, are capable of being probed by equipment similar to that used to perform chip-level testing. For example, the top or outer surface of the cap wafer can be mechanically contacted by a contact-bearing dielectric element of test equipment, the contacts of the test equipment being held in contact with the conductive interconnects of multiple chips of the wafer, as by mechanical force. In such manner, testing is performed through voltages and/or currents applied to an interconnect 303 of each capped chip 300 when the capped chips remain attached in form of the wafer 201 (FIG. 3C). In that way, a plurality of chips of each wafer are simultaneously tested and determined to be good or defective, using equipment that can be less expensive than the above-described test equipment, because the need to mechanically probe the wafer surface directly is eliminated. In a particular embodiment, a greater subset of tests than is generally performed as "wafer-level testing" is performed to the capped chips. This is possible because the wafer containing the capped chips is able to be tested by test equipment that is less expensive than the mechanical probing equipment discussed above. In addition, the ability to test a greater number of the chips at one time permits more testing to be performed per chip for the same total amount of test time using the less expensive test equipment. In a highly preferred embodiment, the capped chips are tested in such equipment for all or nearly all of the same functions ordinarily performed during chip-level testing, prior to the chips being severed from the capped chip-containing wafer into individual capped chips.

One feature of the embodiments described above with reference to FIGS. 1-3D is the use of through holes which are uniformly tapered to become progressively smaller with depth from the top surface of the cap wafer or cap element 100. From the perspective of the top surface 105 (FIG. 3C) a sidewall 107 of each through hole is angled inwardly at an angle typically ranging from about 5 degrees to 70 degrees from the vertical, the vertical being a direction 340 which is normal to directions 342, 344 parallel to the top surface 105. More preferably, the angle of the sidewall 107 to the vertical is between 10 degrees and 60 degrees and, most preferably, between 20 degrees and 60 degrees. In each case shown in FIG. 3C, the diameter of each through hole varies between a larger diameter 335 at the top surface 105 and a smaller diameter 330 at the bottom surface 103. The thickness of the cap 102 illustratively ranges between 100 and 300 μm. The smaller diameter 330 of the through holes at the bottom (inner) surface 103 is on the order of about 40 to 100 μm, and the larger diameter 335 of the through holes at the upper surface 105 of the cap element ranges from twice as large to many times larger than the smaller diameter 330. It is advantageous for through holes to be tapered in this way because wettable layers 106 can be formed on the walls of the through holes by processing directed towards the top or outer surface 105 of the cap element.

In one embodiment of making the through holes, the cap element 100 consists essentially of silicon. Wet chemical etching is applied through openings in a patterned masking layer (not shown) at the top surface 105 to form the through holes, resulting in the sidewall 107 being angled inwardly towards the bottom surface 105 at an angle of about 60 degrees with respect to the vertical.

However, in many cases it is preferable to make the angle between the sidewall and the top surface 105 small, in order to reduce the amount of area occupied by each interconnect. In such case, laser drilling may be used to form through holes in a cap element which consists essentially of silicon, glass, ceramic or other similar material. Laser drilling typically results in through holes which are angled inwardly at an angle of about 7 degrees to the normal, as viewed from the top surface 105 downward. However, when the bond pads of a chip are closely spaced, it may be preferable for the through holes to have a profile other than that shown and described relative to FIG. 3C. When considered in terms of forming interconnects to closely spaced bond pads 208 of a chip 202, it is seen that the larger diameters 335 of the through holes at the top surface 305 of the cap element may well limit the spacing at which such interconnects 303 can be made.

Figure 4:
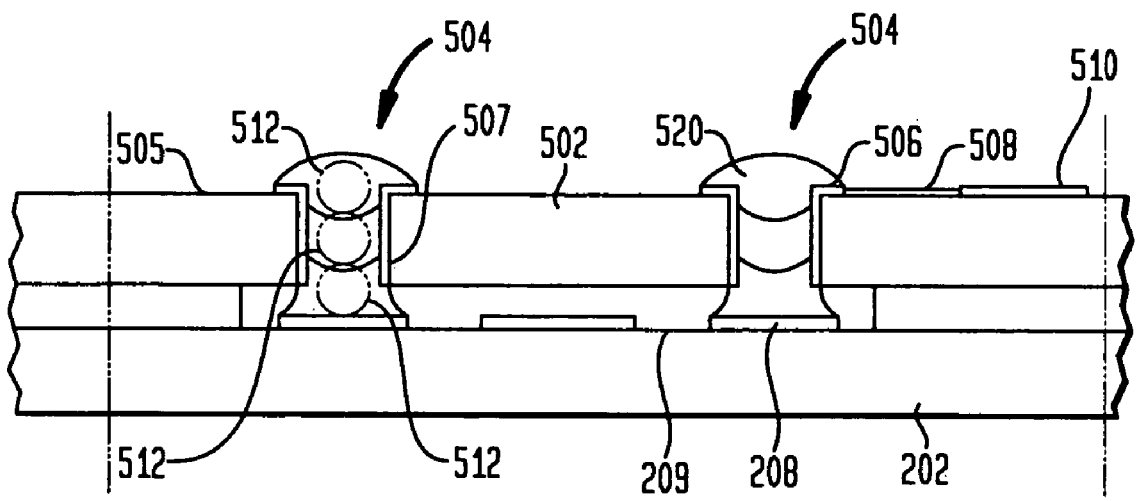
FIG. 4 illustrates a variation of the above embodiment in which conductive interconnects extend upward within vertical walled through holes of a cap element.

As shown in FIG. 4, in a variation of the above-described embodiment, the walls 507 of the through holes 504 of the cap are oriented in a vertical direction with respect to the major surface 209 of the chip 202. In this way, the through holes 504 are disposed at right angles to the outer or top surface 505 of the cap 502. As in the above-described embodiment, wettable metal linings 506 are disposed on the walls 507 of the through holes, and extend onto the top surface 505. These wettable linings are connected to traces 508 which, in turn, connect to contacts 510 disposed on the top surface of the cap 502. Similar to the above-described embodiment, FIG. 4 illustrates a case in which three solder balls (shown in dotted outline form at 512 are sequentially deposited and bonded to the existing structure in each through hole 504 until each through hole is filled.

Once a conductive interconnect 520 is fully formed within a through hole 504 in which the metal lining connects to such metal trace 508, the bond pad of the chip 208 is then connected through the conductive interconnect 520, trace 508 and external contact 510 as a fan-out and redistribution trace.

Figure 5A:
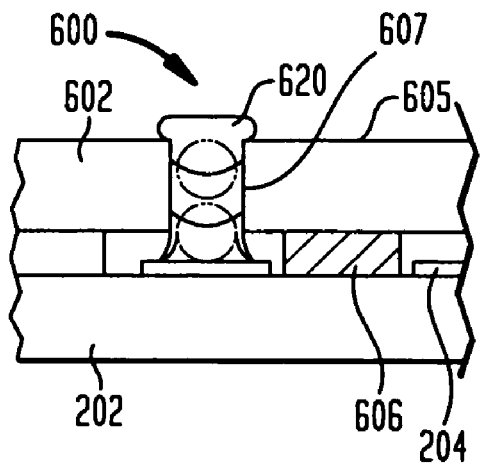
FIGS. 5A and 5B illustrate further variations of the above embodiments in which conductive interconnects are formed in vertical walled through holes which are not lined with a wettable metal.
Figure 5B:
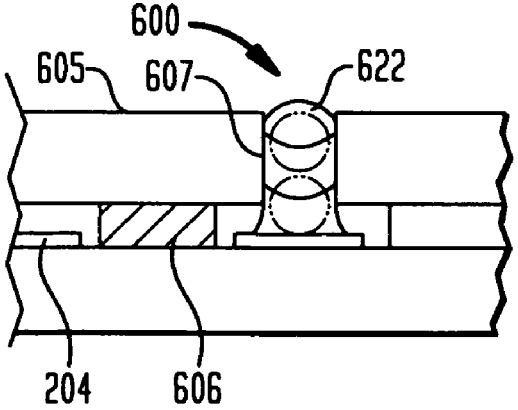

In particular embodiments, shown in partial sectional view in FIGS. 5A and 5B, the walls 607 of the through holes are not lined with wettable layers, e.g., wettable metal linings 506 (FIG. 4) as described above which line the walls 507 of the through holes 504 (FIG. 4). As has been discussed in commonly owned U.S. patent application Ser. No. 10/949,674 (incorporated herein by reference) it is preferred that through holes have vertical walls when conductive interconnects require tight pitch.

However, when through holes have substantially vertical walls, metallic linings are difficult to form via vapor deposition techniques which are preferred therefor. Thus, it is desirable for conductive interconnects to be formed in through holes of cap wafers that are not made of wettable materials or which do not have wettable linings. In such case, with there being no wettable material present at the walls 607, solder or other fusible material applied according to the above-described process has a tendency to draw back from the walls and top surface of the cap 602, rather than to bond to the walls and the top surface. This challenge is uniquely addressed by the process described above of individually positioning and locally heating a mass of fusible conductive material within each through hole. By such process, a solder ball is positioned by a jet of gas onto a surface such as the bond pad where it is then locally heated, as by a laser, to bond the solder ball to the bond pad. Moreover, this process can be repeated one or more times in accordance with the aspect ratio of the through hole until enough of the fusible material has been deposited to fill the through hole and fully form the conductive interconnect.

FIG. 5A illustrates a case in which the fusible conductive material 620 extends above and onto the top surface 605 of the cap. The fusible material 620 exposed above the top surface 605 tends to bead up and project somewhat above the top surface 605. On the other hand, FIG. 5B illustrates a variation in which a smaller amount of the fusible conductive material 622 projects above the top surface 605, such that the fusible conductive material does not overlie the top surface of the cap.

In each of these cases, because of the lack of a wettable lining within the through hole, the conductive interconnect 600 hole may not achieve a seal sufficient for some applications, especially for protecting SAW chips or other electromechanical chips. To achieve the required seal, as illustrated in FIGS. 5A and 5B, the sealing material 606 between the chip 202 and the cap 602 may be disposed at a location laterally between conductive interconnects 600 and the device region 204. Such arrangement is further illustrated in the top-down plan view of FIG. 6A. In a variation of such arrangement, as illustrated in FIG. 6B, conductive interconnects 700 are disposed in locations which are surrounded by the sealing material 706. Examples of such sealing arrangements and processes used to produce them are further described in commonly owned U.S. patent application Ser. No. 10/949,674 which is incorporated by reference herein.

Other, alternative ways of forming the conductive interconnects 700 within the through holes of the chip include methods such as the solder-ball stenciling method and stud-bumping method described in the commonly owned U.S. patent application Ser. No. 10/949,575 ("the '575 application") incorporated by reference herein. In another alternative, conductive interconnects extending from the bond pads to locations exposed at an exterior of the capped chip can be formed by plating, such as described in the '575 application incorporated herein. In yet another alternative, conductive interconnects can be formed by plating up the through holes of the capped wafer after assembling the cap element to the wafer element. In such example, the plated metal preferably extends continuously from the bond pads upward along the walls of the through holes, covering the layer of adhesive exposed between the cap element and the wafer element. The plated metal preferably extends to locations at the top surface of the cap element where it is then available to be contacted by another component of an assembly, such as a circuit panel. Such plated metal layer is preferably formed by a combination of a masked electroless plating onto the exposed surfaces of the through hole, adhesive layer and bond pad, some of which are non-metallic, and then electroplating to finish forming conductive interconnects.

Several embodiments are described above with reference to FIGS. 1 through 6B for fabricating capped chips having vertical conductive interconnects exposed at a top surface of the cap. By virtue of the conductive interconnects provided thereon, the resulting capped chips are adapted for incorporation into higher level assemblies. Several such assemblies and variations thereof are described in commonly owned U.S. patent application Ser. No. 10/949,674 and other applications incorporated by reference herein. Referring to FIG. 7, an advantage of capped chips formed in accordance with the presently described embodiments is that solder exposed at the outer surface 803 of each cap 801 is available for direct surface mounting to wettable metal terminals 804 exposed at a top surface 813 of a substrate 802. Moreover, a variety of substrates can be mated to the capped chip. For example, the capped chip can be mated with substantially rigid circuit panels, e.g., those which include dielectric elements such as BT resins, FR-4 composites, epoxies, ceramics, or glasses. Alternatively, the capped chip can be mated with pliable, tape-like circuit panels, among which are flexible circuit panels or package elements, typically consisting of a material such as polyimide.

Figure 6A:
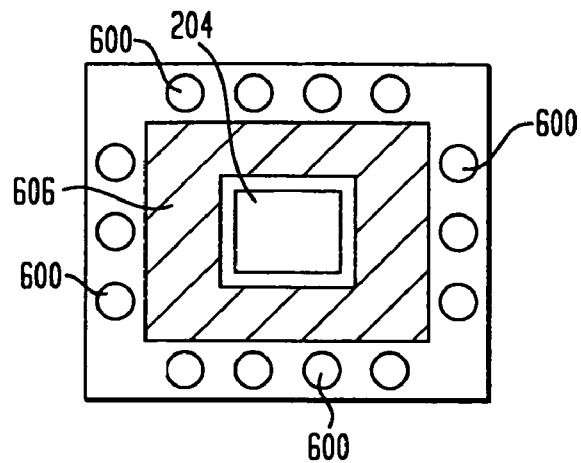
FIGS. 6A and 6B are plan views further illustrating locations of a sealing material in relation to bond pads and an active region of chip in accordance with the embodiments of the invention illustrated in FIGS. 5A and 5B.
Figure 6B:
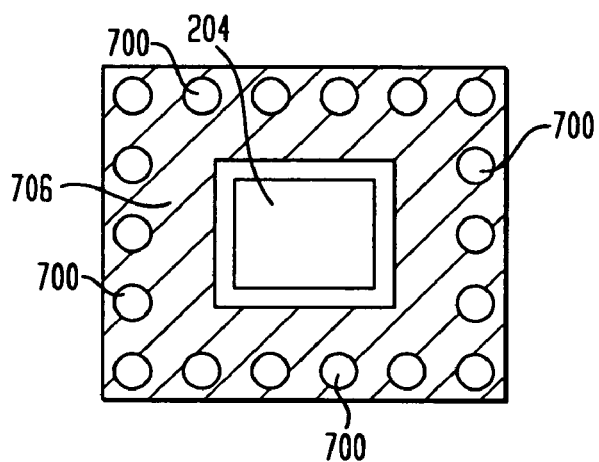
Figure 7:
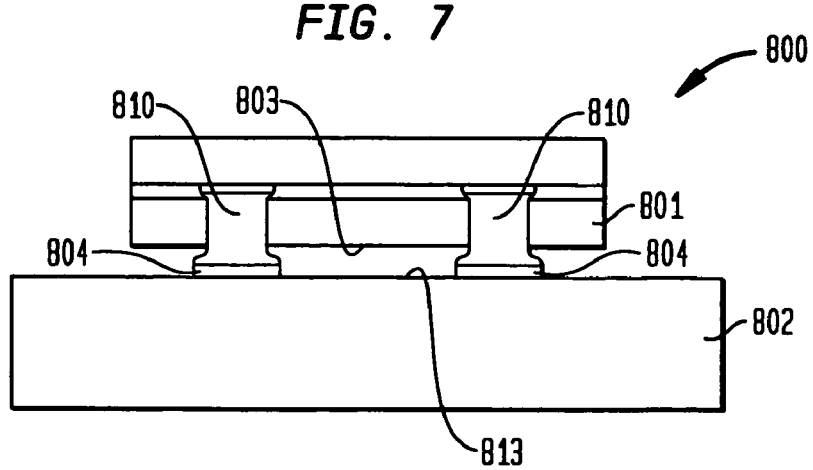
FIG. 7 is a sectional view illustrating an assembly including a capped chip as mounted to a substrate in accordance with an embodiment of the invention.
Figure 8:
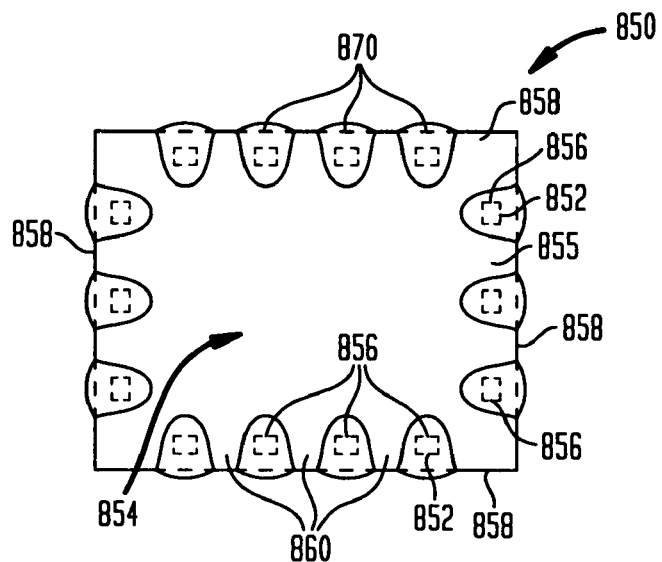
FIG. 8 is a top-down plan view of a capped chip in accordance with another embodiment of the invention.

FIG. 8 is a top-down plan view illustrating a capped or "lidded" chip 850 according to an embodiment of the invention in which, like that shown in FIGS. 6A and 6B, a plurality of bond pads 852 of the chip are located near edges 858 of the chip. In such capped chip, the cap or "lid" 855 (of which the top surface is visible in FIG. 8) covers and protects a device region 854 located at or near the center of the capped chip. The cap 855 has one or more castellated edges, such edges having one or more recesses 856 in the cap material which expose the bond pads of the chip. Between pairs of the recesses 856, finger portions 860 of the cap material are present, the finger portions preferably serving to mechanically support the capped chip. Such capped chips and variations thereof are shown and described in U.S. Provisional Application No. 60/664,129.

Figure 9:
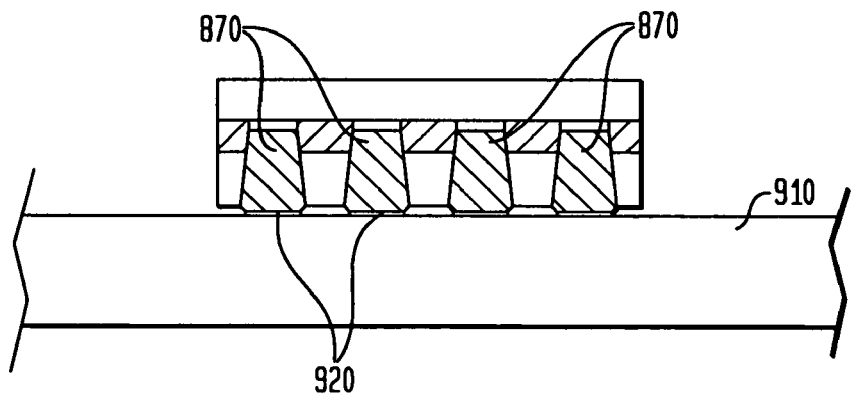
FIG. 9 is a corresponding elevational view of a capped chip in accordance with the embodiment of the invention illustrated in FIG. 8.

FIG. 8 additionally illustrates an embodiment in which the capped chip 850 has been further prepared for surface mounting to an additional element, e.g., to a circuit panel 910 (FIG. 9). The chip is bonded via a flip-chip bonding method, in which the front (bond pad-bearing) face of the chip faces down and is bonded by a bonding material to terminals 920 of the circuit panel. As further illustrated in FIG. 8, masses 870 of bonding material, e.g., a fusible material such as solder, tin or a eutectic composition, are provided on the bond pads 852 of the capped chips, the bond pads having been previously treated to provide solder-bondable regions, e.g., such as commonly referred to as "under-bump metallizations ("UBMs")." The masses of bonding material are preferably fully formed bumps of the fusible material having a height above the front face of the chip close to that or above that of the height of the top surface of the cap above the front face, and the bonding material preferably at least substantially filling or overfilling the volume of the recess. In such way, the capped chip having the bump-filled recesses 870 is ready for bonding to terminals 920 of a circuit panel 910 (FIG. 9) or other element. In this way, the recesses contain sufficient amounts of the fusible material 870 to bond to the terminals 920 of the circuit panel. Alternatively a conductive adhesive (e.g., silver-filled epoxy, solder paste, among others) is deposited within the recesses and caused to bond thereto, as through post-deposition baking.

When the bonding material is a fusible material, e.g., solder, it is preferably deposited and reflowed using a technique similar to that described above of using a tool to position a ball of the material onto a bond pad and then locally heat the ball of material such that it bonds to the bond pad of the chip. This step of bonding the fusible material is preferably performed while the chip remains attached to other chips, e.g., in form of a wafer or portion of a wafer, as capped by a correspondingly sized cap element, such capped wafer structure being as described in U.S. Provisional Application No. 60/664,129 incorporated by reference herein. In such case, the fusible material is positioned and bonded to the chips through openings in a cap element which cross dicing lanes at boundaries between respective chips.

Figure 10A:
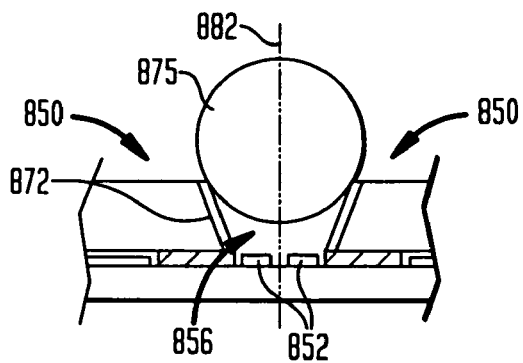
FIG. 10A is a sectional view illustrating a stage in a process of manufacturing capped chips in accordance with the embodiment of the invention illustrated in FIGS. 8 and 9.
Figure 10B:
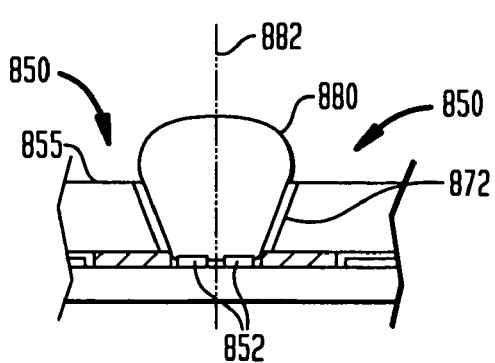
FIG. 10B is a sectional view illustrating a stage subsequent to the stage shown in FIG. 10A in a process of manufacturing capped chips in accordance with the embodiment of the invention illustrated in FIGS. 8 and 9.

Another example of placing and bonding the masses of a fusible material is similar to that described in commonly owned U.S. patent application Ser. No. 10/949,575 incorporated by reference herein. Referring to FIG. 10A, a plurality of capped chips 850 remain attached together as one capped wafer or a capped portion a wafer, the dotted lines indicating dicing lanes which define the boundaries between each capped chip 850. In such method, a multiplicity of balls 875 of fusible material, e.g., of solder, are simultaneously placed at edges of openings or within openings of such capped chip 850 by a stenciling method in which the balls are directed towards the openings in the cap element through the openings in the stencil. Thereafter, a reflow operation is conducted by which the balls are simultaneously melted, such that the molten solder flows onto the exposed bond pads within the openings and fuses to the bond pads to form a bump 880, as shown in FIG. 10B. When the fusible material is applied by this stenciling technique, one or more layers 872 of metal having an outermost layer that is wettable by the fusible material is preferably provided on walls of the openings in the cap. The wettable layer 872 helps assure that during the reflowing operation, molten solder flows down the walls of the openings to contact and fuse to the bond pads of the chips. The openings in the cap element and the wettable layer therein are preferably provided prior to the cap element being joined to the wafer or wafer portion. Alternatively, depending upon the robustness of the adhesive used to bond the cap element to the wafer and the tolerance of the chips to withstand such processing, the openings and/or the wettable layer can be formed after the cap element is joined to the wafer. The wettable layer can be formed in a manner such as described above, e.g., via vapor deposition and/or by plating as by electroless plating and/or electroplating. In addition, at the same time, when the bond pads of the chips have exposed surfaces which are not wettable by a fusible material, such vapor deposition and/or plating techniques can be used to provide one or more wettable layers overlying the bond pads. Once the reflowing step is completed to form bumps 880 such as that shown in FIG. 10B, the capped wafer is severed at dicing lanes 882 to form individual capped chips having fusible conductive material rising upward from the bond pad 852 of each chip to a level near to or above the level of the top surface 855 of the capped chip.

Alternatively, the one or more wettable layers need not be formed on the walls of the through holes, especially when the size of each ball 875 of solder or other fusible conductive material fits well within each opening 856 of the cap such that each such ball 875 contacts the bond pads 852 within the openings in the cap. In such case, the fusible material adheres well to the bond pads and forms a bump within the opening of the capped wafer, except that the bump does not adhere to the walls of the opening. Thereafter, the capped wafer is severed at dicing lanes 882 to form individual capped chips having fusible conductive material rising upward from the bond pad 852 of each chip to a level near to or above the level of the top surface 855 of the capped chip.

Figure 11:
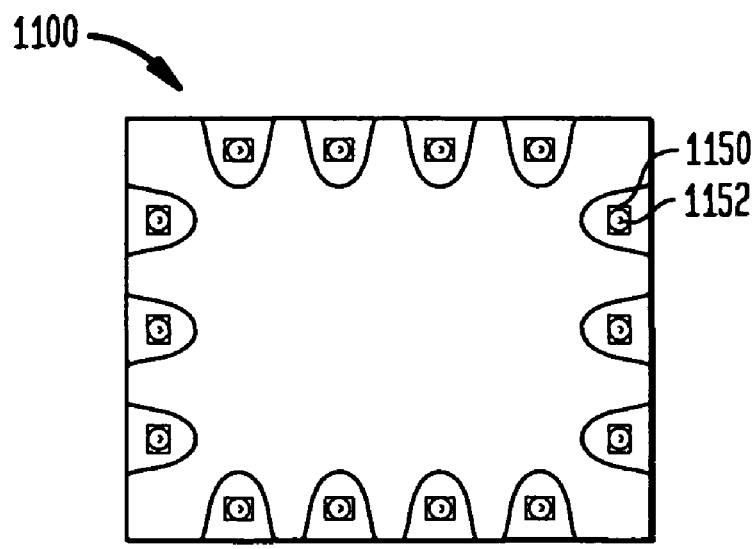
FIG. 11 is a top-down plan view of a capped chip in accordance with a variation of the embodiment of the invention illustrated in FIG. 8.
Figure 12:
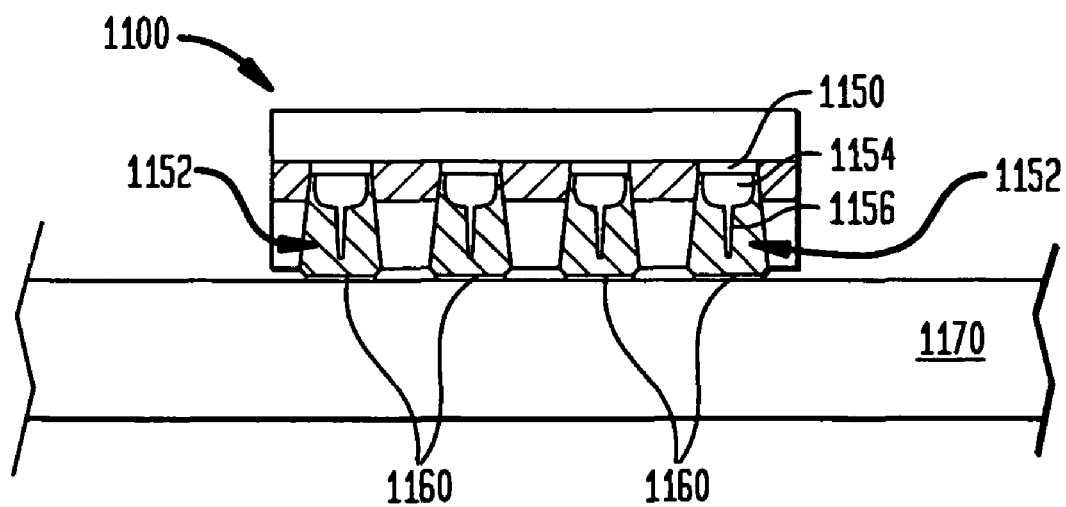
FIG. 12 is a corresponding elevational view of a capped chip in accordance with the embodiment of the invention illustrated in FIG. 11.

FIG. 11 illustrates a capped chip 1100 according to a variation of the above-described embodiment. In this embodiment, instead of providing a wettable layer of metal on surfaces of the bond pads 1150 of each chip, a stud bump 1152 is bonded, e.g., thermosonically, to each bond pad 1150, the bond pads being shown as rectangular-shaped features in FIG. 11 and the stud bumps 1152 shown as circular-shaped features. Stud bumps typically include a noble metal, especially gold. As best seen in the sectional view provided in FIG. 12, stud bumps 1152 are formed by a tool such as a wire-bonding tool which bonds a molten ball-like mass 1154 of metal onto a bond pad 1150 and then pulls away from the mass, leaving a stub-like wire 1156 projecting from the mass. With the stud bumps attached to the bond pads, the capped chip 1100 can be bonded to terminals 1160 of another component such as a circuit panel 1170 or circuit board, such as through masses of a fusible material, e.g., solder, or conductive adhesive which bridges the space between terminals 1160 and stud bumps 1152. In a particular embodiment, bumps of solder can be pre-formed on the terminals of the circuit panel for bonding to the bond pads 1150 on the chip. Alternatively, bumps of solder can be provided on the stud bumps for bonding to the terminals of the circuit panel.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A method of forming a capped chip including a conductive interconnect extending vertically through a cap thereof, the method comprising:

providing a cap having an outer surface, an inner surface opposite said outer surface, and a plurality of through holes extending between said outer and inner surfaces;

aligning and joining said cap to a chip having a front face, a device region at said front face and a plurality of bond pads disposed at said front face, such that said inner surface of said cap faces said front face of said chip and said plurality of through holes each expose at least a region of a corresponding one of said plurality of bond pads;

positioning a mass of fusible conductive material through a first through hole of said plurality of through holes onto a first bond pad of said plurality of bond pads;

heating said positioned mass of fusible conductive material such that said mass flows, entirely covers the region of said first bond pad that is exposed by said first through hole, and thereby bonds to said first bond pad, said steps of positioning and heating said mass of fusible conductive material forming at least a portion of a conductive interconnect extending from said first bond pad at least partially through said first through hole;

positioning a further mass of said fusible conductive material in contact with said bonded mass;

heating said further mass until said further mass bonds with said bonded mass, thereby increasing a height of said conductive interconnect above said first bond pad, wherein said step of aligning and joining said cap to said chip includes providing a sealing medium between said front face of said chip and said inner surface of said cap, wherein said sealing medium separates said device region from said plurality of bond pads, and said step of positioning said mass of fusible conductive material includes dispensing a ball-shaped mass of said fusible conductive material, and said fusible conductive material includes at least one material selected from the group consisting of solder, tin and a eutectic composition; and prior to aligning and joining said cap to said chip, forming wettable layers surrounding said plurality of bond pads and on walls of said plurality of through holes, wherein said step of heating said positioned mass wets said first bond pad and wets a first wall of said first through hole.

2. A method of forming a capped chip including a conductive interconnect extending vertically through a cap thereof, the method comprising:

providing a cap having an outer surface, an inner surface opposite said outer surface, and a plurality of through holes extending between said outer and inner surfaces;

aligning and joining said cap to a chip having a front face, a device region at said front face and a plurality of bond pads disposed at said front face, such that said inner surface of said cap faces said front face of said chip and said plurality of through holes each expose at least a region of a corresponding one of said plurality of bond pads;

positioning a mass of fusible conductive material through a first through hole of said plurality of through holes onto a first bond pad of said plurality of bond pads;

heating said positioned mass of fusible conductive material such that said mass flows, entirely covers the region of said first bond pad that is exposed by said first through hole, and thereby bonds to said first bond pad, said steps of positioning and heating said mass of fusible conductive material forming at least a portion of a conductive interconnect extending from said first bond pad at least partially through said first through hole;

positioning a further mass of said fusible conductive material in contact with said bonded mass; and heating said further mass until said further mass bonds with said bonded mass, thereby increasing a height of said conductive interconnect above said first bond pad, wherein said mass is a first mass, and said step of positioning said mass includes simultaneously positioning a second mass of said fusible conductive material through a second through hole of said plurality of through holes onto a second bond pad of said plurality of bond pads, and said step of heating said mass includes simultaneously heating said positioned second mass of fusible conductive material, such that said second mass bonds to said second bond pad to form at least a portion of a second conductive interconnect extending from said second bond pad at least partially through said second through hole, and said step of positioning said second mass includes dispensing said fusible conductive material in a second nominal volume exceeding a first nominal volume of said first mass by more than 20%.

3. The method as claimed in claim 2, wherein said steps of positioning and heating said first mass, and positioning and heating said second mass are performed sequentially at a time when said chip remains attached to other chips in form of at least a portion of a wafer.

4. The method as claimed in claim 2, further comprising, performing the following steps in sequential order for each i$^{th}$ bond pad of said plurality of bond pads, after heating said second mass to bond said second mass to said second bond pad, positioning an $i^{th}$ mass of fusible conductive material through an $i^{th}$ through hole of said plurality of through holes onto said $i^{th}$ bond pad; and heating said $i^{th}$ mass such that said heated $i^{th}$ mass bonds to said $i^{th}$ bond pad, said steps of positioning and heating said $i^{th}$ mass forms at least a portion of an $i^{th}$ conductive interconnect extending from said $i^{th}$ bond pad at least partially through said $i^{th}$ through hole.

5. The method as claimed in claim 2, wherein said second nominal volume is dispensed in said step of positioning said second mass by an apparatus which positions and heats said first nominal volume, said second nominal volume being determined by adjusting said apparatus according to at least one of a width of said second through hole and a vertical separation distance between said inner surface of said cap and said front surface of said chip at said second through hole.

* * * * *